(12) United States Patent
Xu et al.

(10) Patent No.: US 12,464,713 B2
(45) Date of Patent: Nov. 4, 2025

(54) MEMORY CIRCUITRY COMPRISING STRINGS OF MEMORY CELLS AND METHOD USED IN FORMING A MEMORY ARRAY COMPRISING STRINGS OF MEMORY CELLS

(71) Applicant: Micron Technology, Inc., Boise, ID (US)

(72) Inventors: Lifang Xu, Boise, ID (US); Richard J. Hill, Boise, ID (US); Yoshiaki Fukuzumi, Kanagawa (JP); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 808 days.

(21) Appl. No.: 17/665,346

(22) Filed: Feb. 4, 2022

(65) Prior Publication Data
US 2023/0255023 A1  Aug. 10, 2023

(51) Int. Cl.
*H01L 27/11556* (2017.01)
*H01L 21/3205* (2006.01)
(Continued)

(52) U.S. Cl.
CPC ......... *H10B 41/27* (2023.02); *H01L 21/3205* (2013.01); *H01L 21/4763* (2013.01); *H01L 21/70* (2013.01); *H10B 12/0387* (2023.02); *H10B 41/10* (2023.02); *H10B 43/10* (2023.02); *H10B 43/27* (2023.02); *G11C 16/0483* (2013.01)

(58) Field of Classification Search
CPC . H01L 21/3205; H01L 21/4763; H01L 21/70; H01L 23/481; H01L 2225/06541–06544; H10B 12/0387; H10B 41/10; H10B 43/10; H10B 41/50; H10B 43/50; H10B 20/40–65; H10B 53/20; H10B 41/20–27; H10B 43/20–27; H10B 51/20; H10B 63/84–845; H10B 12/482;
(Continued)

(56) References Cited

U.S. PATENT DOCUMENTS

2019/0067314 A1* 2/2019 Lu .................. H10B 43/27
2020/0328222 A1 10/2020 Barclay et al.
(Continued)

OTHER PUBLICATIONS

U.S. Appl. No. 17/373,121, filed Jul. 12, 2021, by Xu et al.

*Primary Examiner* — Cuong B Nguyen
(74) *Attorney, Agent, or Firm* — Wells St. John P.S.

(57) ABSTRACT

Memory circuitry comprising strings of memory cells comprising memory blocks individually comprises a vertical stack comprising alternating insulative tiers and conductive tiers. Channel-material strings of memory cells extend through the insulative tiers and the conductive tiers in a memory-array region. The insulative tiers and the conductive tiers of the memory blocks extend from the memory-array region into a stair-step region. Individual of the memory blocks in the stair-step region comprise a flight of operative stairs. Individual of the operative stairs comprise one of the conductive tiers. At least some immediately-laterally-adjacent of the individual memory blocks in the stair-step region have their flights of operative stairs laterally-separated by a stack comprising two vertically-alternating different-composition insulative materials. Other embodiments, including method, are disclosed.

20 Claims, 22 Drawing Sheets

(51) Int. Cl.
*H01L 21/4763* (2006.01)
*H01L 21/70* (2006.01)
*H10B 12/00* (2023.01)
*H10B 41/10* (2023.01)
*H10B 41/27* (2023.01)
*H10B 43/10* (2023.01)
*H10B 43/27* (2023.01)
*G11C 16/04* (2006.01)

(58) Field of Classification Search
CPC ... H10B 12/488; H10B 80/00; G11C 16/0483
See application file for complete search history.

(56) References Cited

U.S. PATENT DOCUMENTS

2021/0366920 A1* 11/2021 Tokita .................. H10D 84/038
2022/0181283 A1* 6/2022 Hosoda .................. H01L 25/50

* cited by examiner

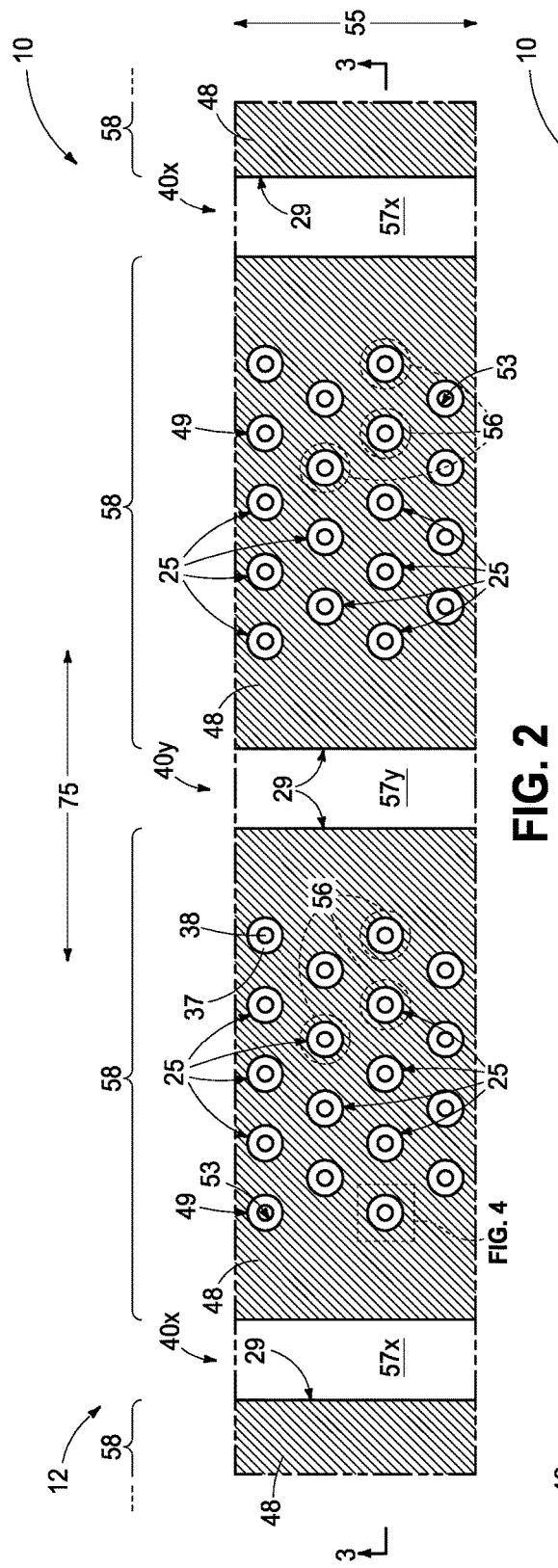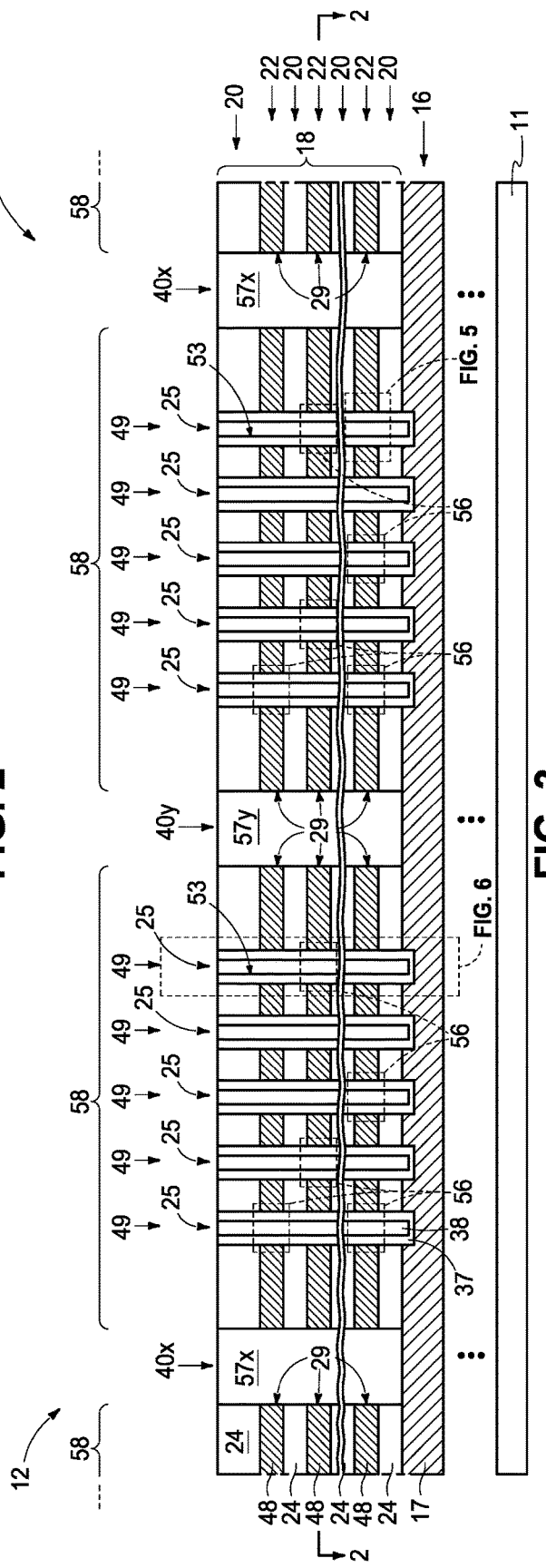

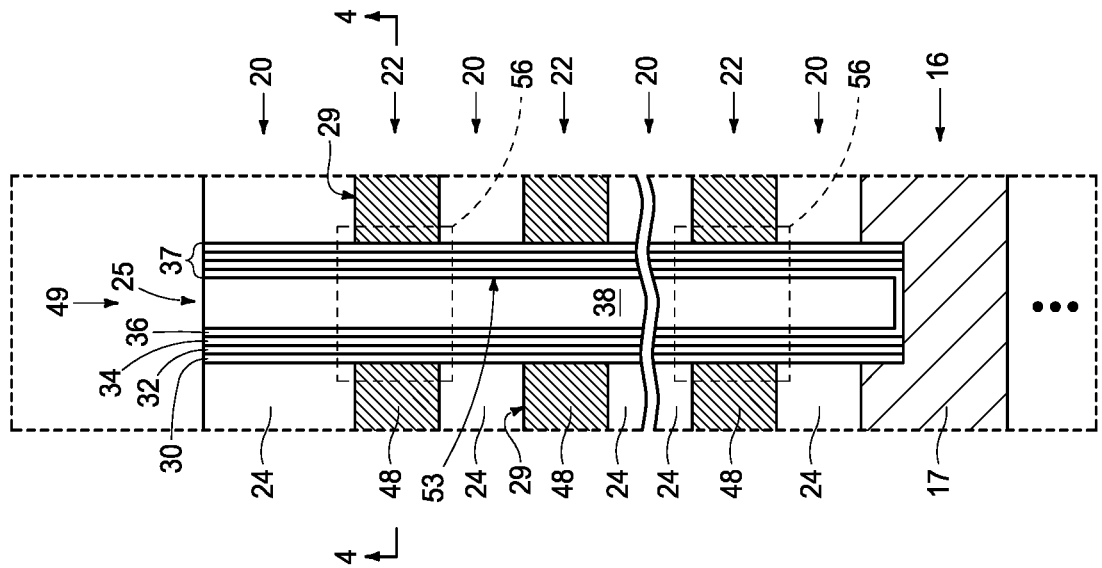
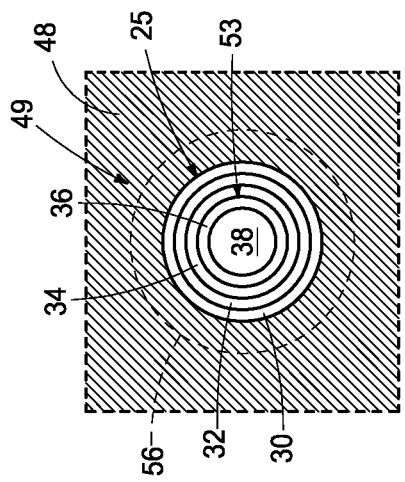
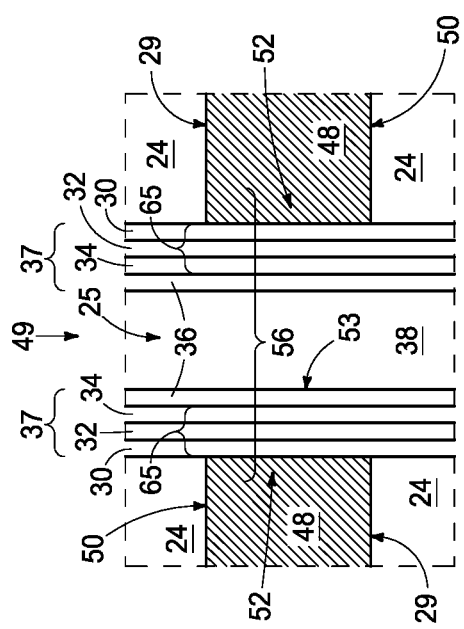

MEMORY CIRCUITRY COMPRISING STRINGS OF MEMORY CELLS AND METHOD USED IN FORMING A MEMORY ARRAY COMPRISING STRINGS OF MEMORY CELLS

TECHNICAL FIELD

Embodiments disclosed herein pertain to memory circuitry comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 2-13 are diagrammatic sectional, expanded, enlarged, and/or partial views of the construction of FIG. 1 or portions thereof, and/or of alternate embodiments thereof.

DETAILED DESCRIPTION OF EXAMPLE EMBODIMENTS

Figure 1:
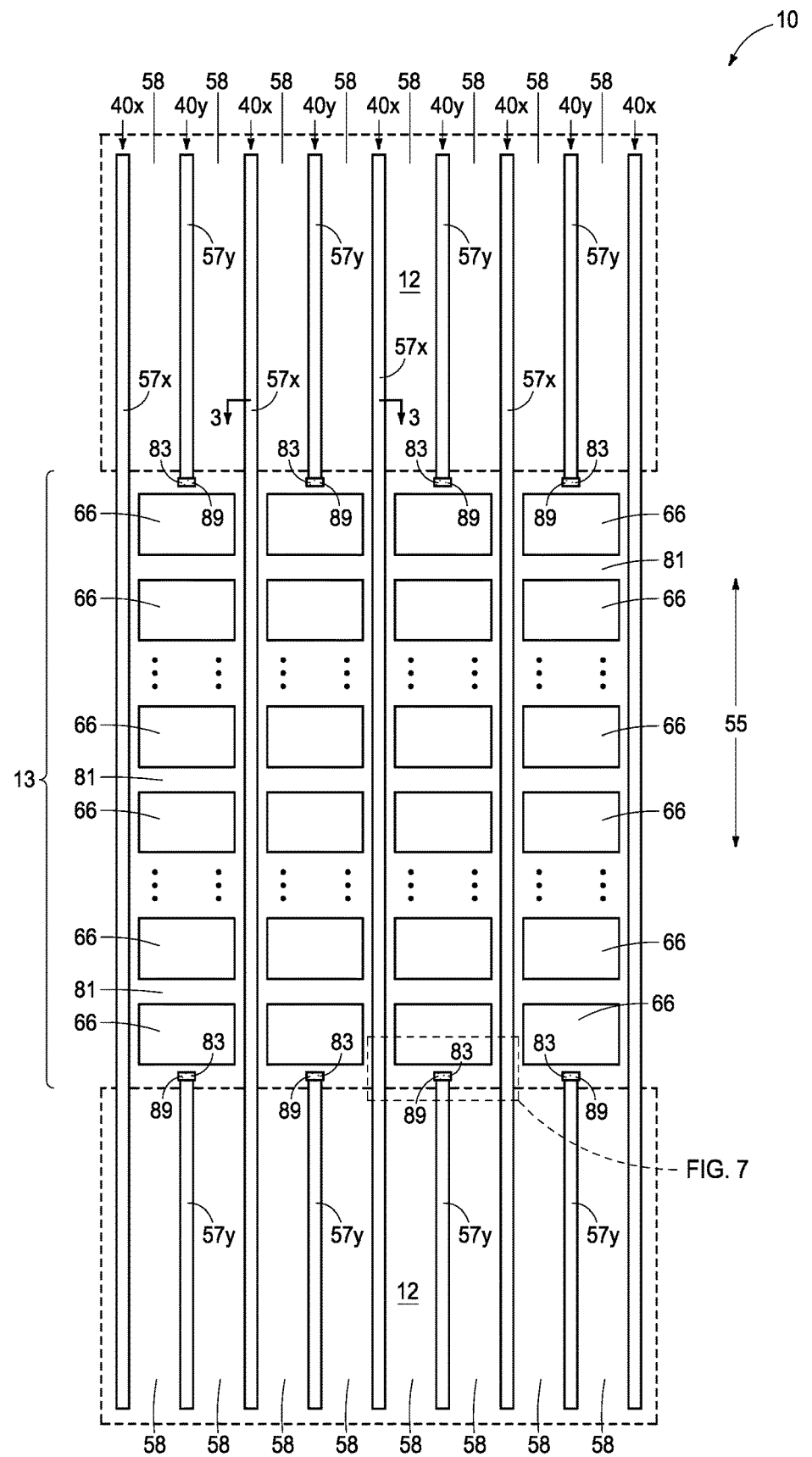
FIG. 1 is a diagrammatic view of a portion of memory circuitry comprising strings of memory cells in accordance with an embodiment of the invention.

FIGS. 1-12 show a construction 10 comprising memory circuitry having two memory-array regions 12 comprising elevationally-extending strings 49 of transistors and/or memory cells 56 (e.g., comprising NAND). A stair-step region 13 is between memory-array regions 12. Construction 10 may comprise only a single memory-array region 12 or may comprise more than two memory-array regions 12 (neither being shown). FIGS. 7-12 are of different and varying scales compared to FIGS. 1-6 for clarity in disclosure more pertinent to components in stair-step region 13 than in memory-array regions 12. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-12 depicted materials. For example, other partially or wholly fabricated components of integrated circuitry may be provided somewhere above, about, or within base substrate 11. Control and/or other peripheral circuitry for operating components within an array (e.g., individual array regions 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., $WSi_x$ atop conductively-doped polysilicon) is above substrate 11. Conductor tier 16 may comprise part of control circuitry (e.g., peripheral-under-array circuitry and/or a common source line or plate) used to control read and write access to the transistors and/or memory cells in array 12. A vertical stack 18 comprising vertically-alternating insulative tiers 20 and conductive tiers 22 is directly above conductor tier 16. In some embodiments, conductive tiers 22 may be referred to as first tiers 22 and insulative tiers 20 are referred to as second tiers 20. Insulative tiers 20 and conductive tiers 22 extend from memory-array region 12 into stair-step region 13. Example thickness for each of tiers 20 and 22 is 20 to 60 nanometers. The example uppermost tier 20 may be thicker/thickest compared to one or more other tiers 20 and/or 22. Only a small number of tiers 20 and 22 is shown in FIGS. 2-6 (more and varied shown in FIGS. 8-12 as compared to FIGS. 2-6 due to scale(s) and for clarity in stair-step region 13), with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory blocks 58. In this document, "block" is generic to include "sub-block". Memory blocks 58 may be considered as being longitudinally elongated and oriented, for example along a first direction 55 (e.g., that is different from a second direction 75). Any alternate existing or future-developed arrangement and construction may be used.

The two memory-array regions 12 may be of the same or different constructions relative one another. Regardless, channel-material strings (e.g., 53) of memory cells (e.g., 56) extend through the insulative tiers (e.g., 20) and the conductive tiers (e.g., 22) in memory blocks (e.g., 58) in each of two memory-array regions 12.

Example memory blocks 58 are shown as at least in part having been defined by horizontally-elongated trenches 40* that were formed (e.g., by anisotropic etching) into stack 18 (an * being used as a suffix to be inclusive of all such same-numerically-designated components that may or may not have other suffixes). Trenches 40* will typically be wider than channel openings 25 (e.g., 3 to 10 times wider). Trenches 40* may have respective bottoms that are directly against conductor material 17 (e.g., atop or within) of conductor tier 16 (as shown) or may have respective bottoms that are above conductor material 17 of conductor tier 16 (not shown). Walls 57* are individually in trenches 40* between immediately-laterally-adjacent memory blocks 58 (i.e., there being no other memory block 58 laterally between memory blocks 58 that are immediately-laterally-adjacent one another). Walls 57* may provide lateral electrical isolation (insulation) between immediately-laterally-adjacent memory blocks 58. Walls 57* may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Walls 57* may taper laterally inward and/or outward in vertical cross-section (not shown). Walls 57* may include through-array-vias (TAVs, and not shown).

In one embodiment, walls 57* comprise a first set of the walls that extend from one of the two memory-array regions into the other of the two memory-array regions across the stair-step region (e.g., walls 57x comprising such a first set). In such embodiment, walls 57* comprise a second set of walls that do not extend from one of the two memory-array regions into the other of the two memory-array regions across the stair-step region (e.g., walls 57y comprising such a second set). In one embodiment, the walls of the second set individually comprise an end portion that is in a stack comprising two vertically-alternating different-composition insulative materials (e.g., 83 or 83a in stack 69 comprising materials 24 and 26 as described below).

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 4-6 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual operative channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 (operative channel-material string 53) is directly electrically coupled with conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled with conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Example conductive tiers 22 comprise conducting material 48 that is part of individual conductive lines 29 (e.g., wordlines) that extend across stair-step region 13 along first direction 55 into and within individual memory blocks 58 in each of two memory-array regions 12 (e.g., around/aside stair-step structures 66, referred to below). Conductive lines 29 comprise part of elevationally-extending strings 49 of individual transistors and/or memory cells 56. A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 7:
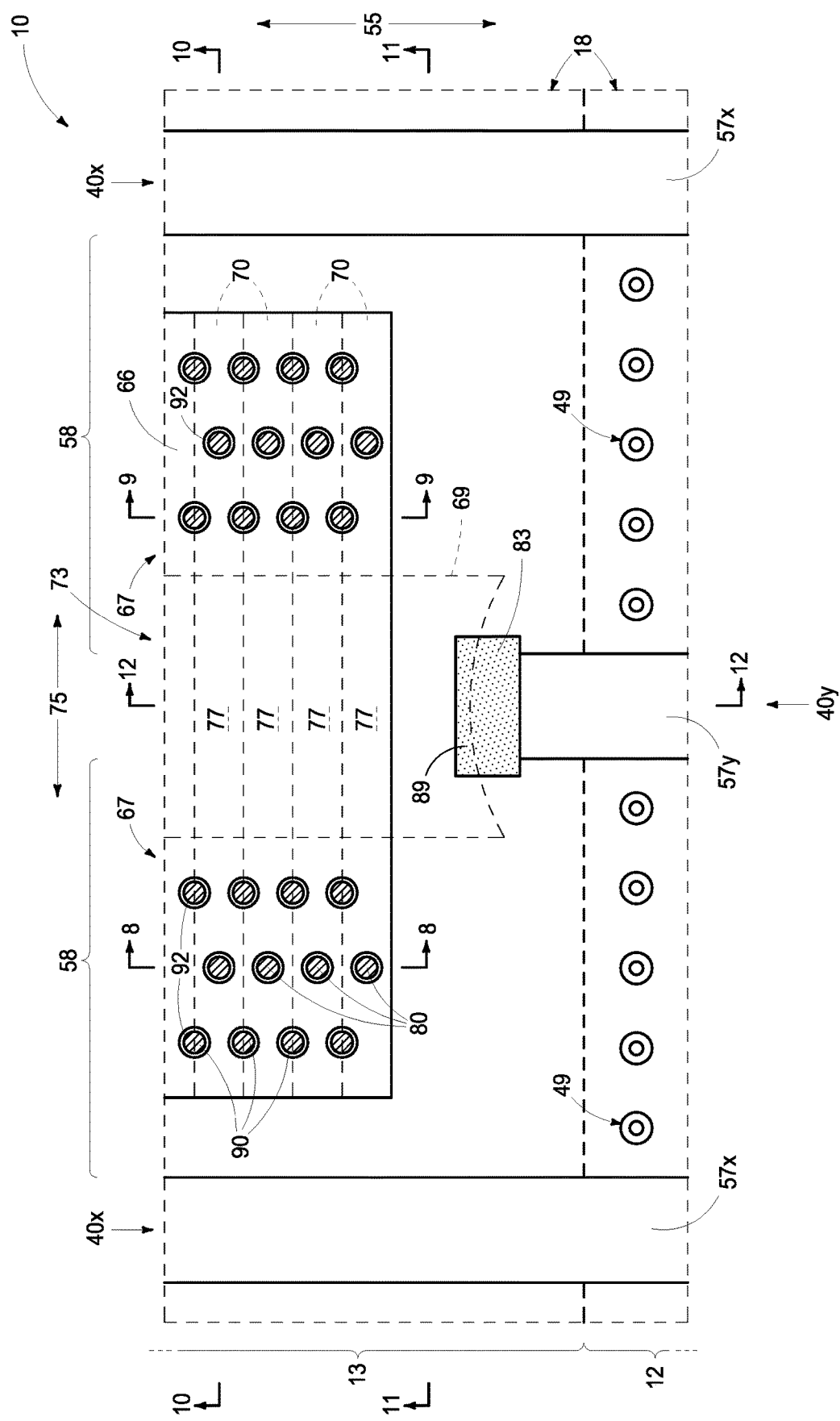

Example stair-step region 13 comprises stair-step structures 66 that are laterally between immediately-adjacent walls 57*. Only a small portion of one stair-step structure 66 is shown in FIG. 7 for clarity largely pertinent to some aspects of the inventions. That example stair-step structure in the example depicted embodiment is one most-proximate to one of memory-array regions 12. Individual memory blocks 58 in the stair-step region 13 comprise a flight 67 of operative stairs 70. Example operative stairs 70 individually comprise a tread 71, a riser 72, one of insulative tiers 20 (i.e., at least one), and one of conductive tiers 22 (i.e., at least one). Individual operative stairs 70 are shown as having a top region that is one of insulative tiers 20 and a next-lower region that is one of conductive tiers 22, although this may be reversed (not shown). Only a single flight of stairs may be used and if multiple flights are used, one of such may be dummy (i.e., a circuit-inoperative structure; e.g., an opposing flight of inoperative stairs [not shown] may be opposite flight 67). A crest 81 is adjacent and between immediately-adjacent stair-step structures 66. Example vertical stack 18 comprises insulator material 82 in stair-step region 13 that is directly above stairs 70 (e.g., a combination of a silicon nitride liner directly against stairs 70, with silicon dioxide thereover).

In one embodiment and as shown, at least some immediately-laterally-adjacent of individual memory blocks 58 in stair-step region 13 have their flights 67 of operative stairs 70 laterally-separated by a stack 69 comprising two vertically-alternating different-composition insulative materials 24 and 26 (e.g., silicon dioxide and silicon nitride, respectively). An example horizontal outline of stack 69 is shown in dashed lines in FIG. 7. In one such embodiment, the at least some are only some and are every-other-one of memory blocks 58. For example, in the depicted embodiment, immediately-adjacent memory blocks 58 that are between immediately-adjacent walls 57x are an example some that satisfy both criteria whereas immediately-adjacent memory blocks 58 that are separated by a single wall 57*x* are not and do not.

In one embodiment, construction 10 comprises walls (e.g., 57*x*) that are individually laterally between at least some of the immediately-laterally-adjacent memory blocks in the stair-step region and in the memory-array region, with individual of such walls (e.g., 57*x*) being laterally between immediately-adjacent of flights 67 of operative stairs 70. Regardless, in one embodiment, walls 57* comprise a first set of walls (e.g., walls 57*x*) and a second set of walls (e.g., walls 57*y*), with the walls of the first and second sets being individually laterally between immediately-adjacent memory blocks 58. The walls of one of the first and second sets (e.g., walls 57*x*) are horizontally longer than the walls of the other of the first and second sets (e.g., walls 57*y*), with in one such embodiment individual walls of the other of the first and second sets (e.g., walls 57*y*) laterally alternating every-other-one with individual walls of the one of the first and second sets (e.g., walls 57*x*).

Regardless, in one embodiment, and as shown, at least some immediately-laterally-adjacent memory blocks 58 in stair-step region 13 have their flights 67 of operative stairs 70 laterally-separated by a flight 73 of inoperative stairs 77. In one such embodiment, flight 73 of inoperative stairs 77 comprises stack 69 comprising two vertically-alternating different-composition insulative materials 24, 26 and in one such latter embodiment wherein individual inoperative stairs 77 (i.e., at least some) comprise only one of each of two different-composition insulative materials 24, 26. In one embodiment, construction 10 comprises walls 57*y* that are individually laterally between immediately-laterally-adjacent memory blocks 58 in memory-array region 12, with such walls 57*y* not being laterally-adjacent flights 67 of operative stairs 70. In one embodiment, walls 57*y* individually comprise an end portion 83 (comprising material 89) that is in stack 69 comprising two vertically-alternating different-composition insulative materials 24, 26 (i.e., is at least partially in stack 69 and as shown). Material 89 of end portion 83 may be of the same composition(s) or of different composition(s) as portions of wall 57*y* distal there-from (different being shown by stippling of material 89 in end portion 83). Regardless, in one embodiment walls 57*y* individually are horizontally-longitudinally-elongated (e.g., along direction 55) and end portion 83 is everywhere horizontally-longitudinally-spaced from where all of channel-material strings 53 extend through insulative tiers 20 and conductive tiers 22. In one such embodiment and as shown, end portion 83 has a maximum lateral width that is greater than a maximum lateral width of that portion of its wall 57*y* that is not horizontally-longitudinally-spaced from where all of channel-material strings 53 extend through insulative tiers 20 and conductive tiers 22. Alternately, the end portion may have the same maximum lateral width or lesser maximum lateral width than that portion (neither being shown).

In one embodiment, conductive vias 80 extend through insulator material 82 and are individually directly against conducting material 48 (e.g., of a conductive line 29) that is in one conductive tier 22 in one of individual stairs 70. In one embodiment, TAVs 90 individually extend through stack 18. Example conductive vias 80 and TAVs 90 have an example insulative-material lining 92 circumferentially there-about (shown as a solid dark line in FIGS. 8 and 9 due to scale). Lining 92 may not be about conductive vias 80 (not shown) if only extending through insulative material(s). Conductive vias 80 may be routed horizontally (not shown) above stack 18 and connect (not shown) with individual TAVs 90 that extend through stack 18 to circuitry therebelow. Such horizontal routing may be through TAVs extending through walls 57 and/or adjacent stair-step region 13 (neither being shown in FIGS. 1-12). Example TAVs 90 are shown extending through conductor tier 16. Alternately, such may stop atop or within conductor tier 16. Regardless, conductor tier 16 may be vertically-segmented in one of more of the FIGS. 8-12 cross-sections (not shown) as opposed to being horizontally-continuous (as shown). TAVs 90 may be between stair-step structures 66 and array region 12 (not shown in FIG. 7). Formation of TAVs 90 and formation of conductive vias 80 may occur at the same time or at different times. Further, the region between stair-step structure 66 and array region 12 may include stairs for select-gate-drain (SGD) conductive vias (neither being shown). Some conductive vias 80 and/or TAVs 90 may be dummy.

Any other attribute(s) or aspect(s) as shown and/or described herein with respect to other embodiments may be used with respect to the above-described embodiments.

Figure 13:
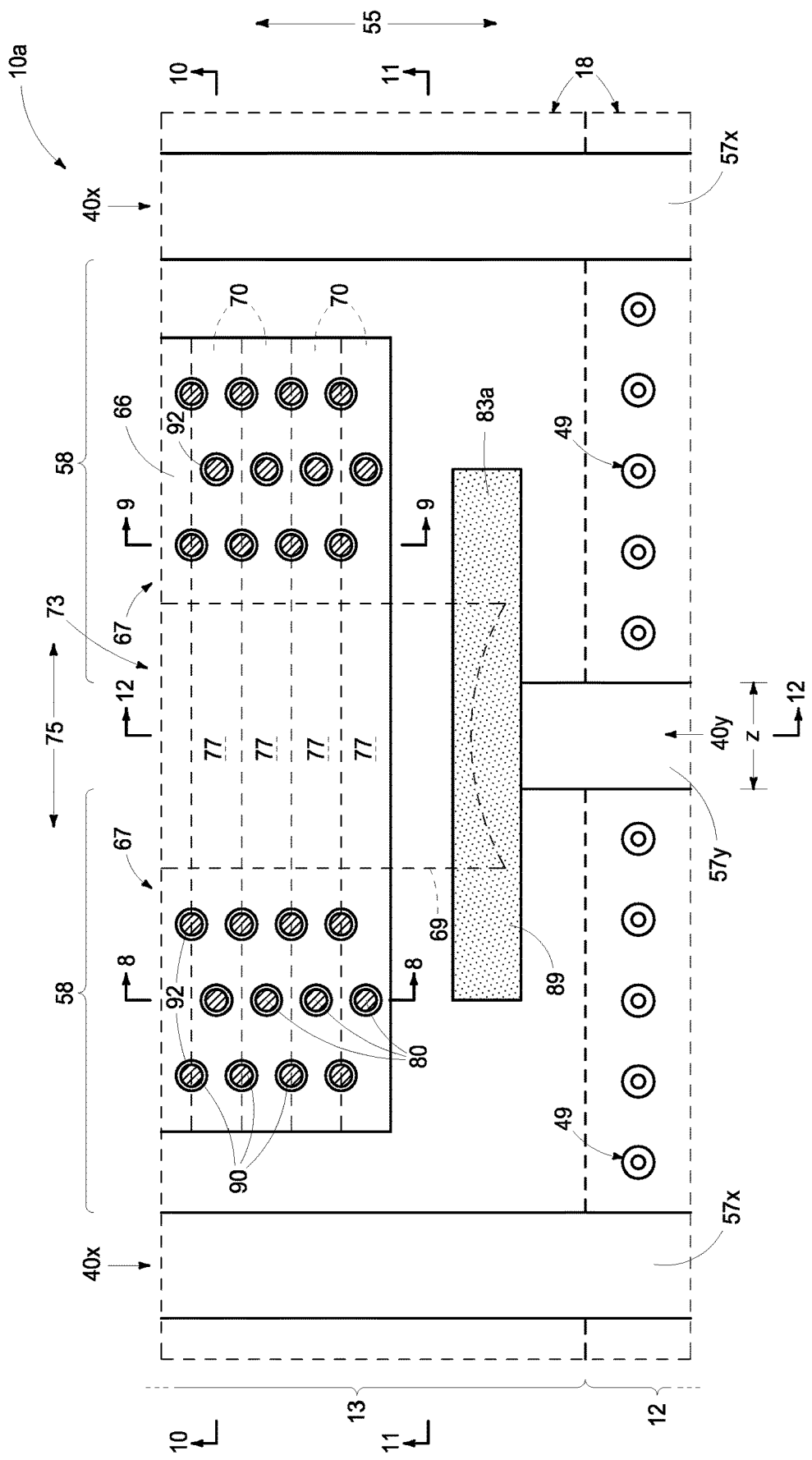

An alternate example construction 10*a* is shown by FIG. 13. Like numerals from the above-described embodiments have been used where appropriate, with some construction differences being indicated with the suffix "a". Example construction 10*a* comprises an end portion 83*a* having a greater maximum lateral width than that shown by FIG. 7 for construction 10. Any other attribute(s) or aspect(s) as shown and/or described herein with respect to other embodiments may be used.

In one embodiment, memory circuitry comprising strings (e.g., 49) of memory cells (e.g., 56) comprises memory blocks (e.g., 58) individually comprising a vertical stack (e.g., 18) comprising alternating insulative tiers (e.g., 20) and conductive tiers (e.g., 22). Channel-material strings (e.g., 53) of memory cells (e.g., 56) extend through the insulative tiers and the conductive tiers. Walls (e.g., 57*) are individually laterally between immediately-laterally-adjacent of the individual memory blocks. At least some of the walls (e.g., 57*y*) individually comprise an end portion (e.g., 83, 83*a*) that is in a stack (e.g., 69) comprising two vertically-alternating different-composition insulative materials (e.g., 24, 26; e.g., independent of whether possessing other attributes of construction 10/10*a* as stated herein).

In one such embodiment the walls are individually horizontally-longitudinally-elongated (e.g., along direction 55), the end portion is everywhere horizontally-longitudinally-spaced from where all of the channel-material strings extend through the insulative tiers and the conductive tiers, the end portion has a maximum lateral width that is greater than a maximum lateral width of that portion of its wall that is not horizontally-longitudinally-spaced from where all of the channel-material strings extend through the insulative tiers and the conductive tiers (e.g., end portions 83 and 83*a*). In one such latter embodiment, the maximum lateral width of the end portion is less than twice as great as the maximum lateral width of that portion of its wall that is not horizontally-longitudinally-spaced from where all of the channel-material strings extend through the insulative tiers and the conductive tiers (e.g., end portion 83). In an alternate such latter embodiment, the maximum lateral width of the end portion is at least twice (in one embodiment at least three times) as great as the maximum lateral width of that portion of its wall that is not horizontally-longitudinally-spaced from where all of the channel-material strings extend through the insulative tiers and the conductive tiers (e.g., end portion 83*a*).

Embodiments of the invention encompass methods used in forming memory circuitry comprising strings of memory cells. Embodiments of the invention encompass memory circuitry comprising strings of memory cells independent of method of manufacture. Nevertheless, such memory circuitry may have any of the attributes as described herein in method embodiments. Likewise, the described method embodiments may incorporate, form, and/or have any of the attributes described with respect to structure embodiments.

Example first method embodiments are described largely with reference to FIGS. 14-20 to form a construction analogous to construction 10 of FIGS. 1-12. Such method may occur independent of order of processing steps unless otherwise so stated or inherent. Like numerals have been used for predecessor constructions to that of FIGS. 1-12.

Figure 14:
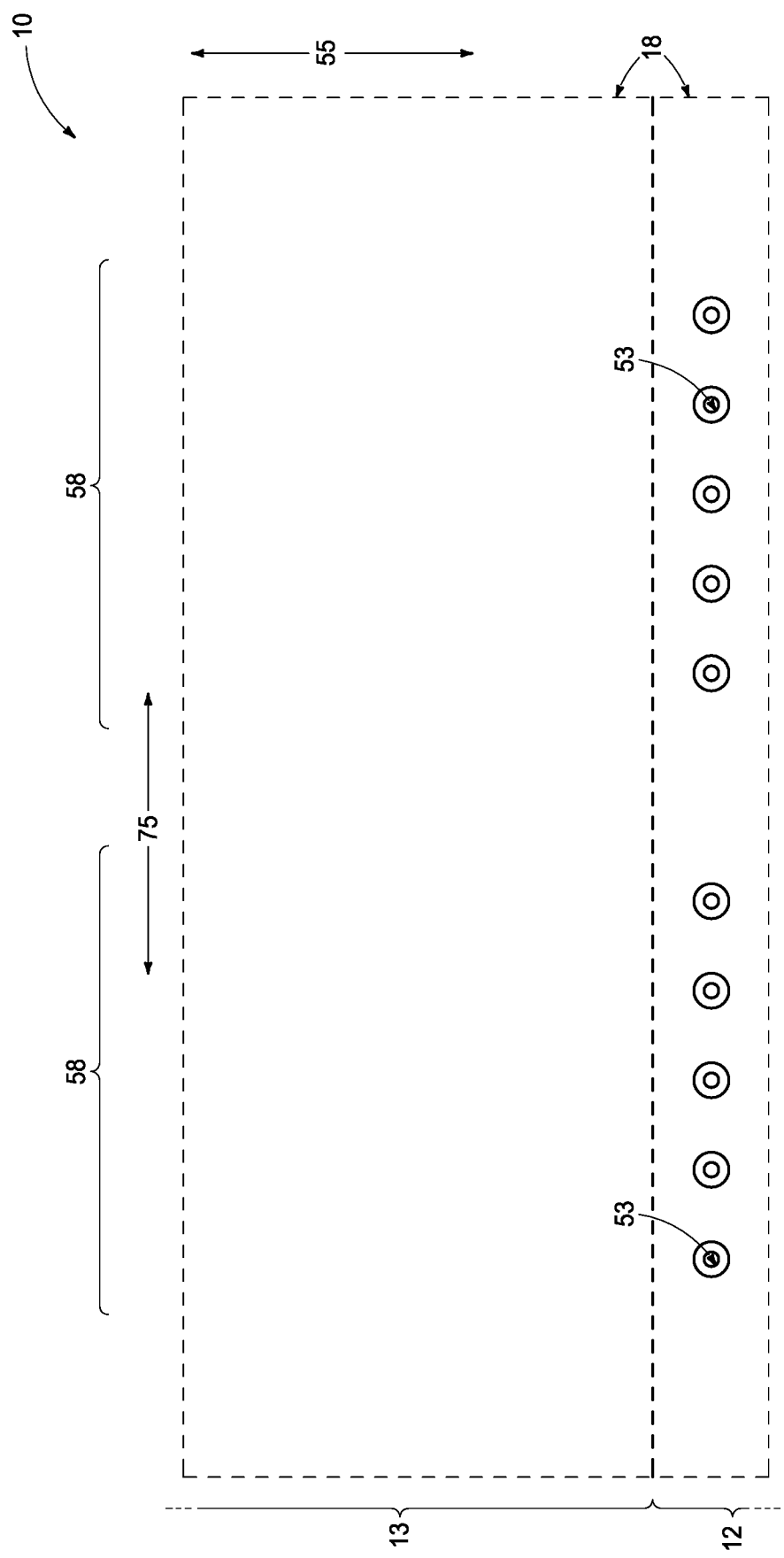
FIGS. 14-26 show example method embodiments of the invention.

Referring to FIG. 14, an example such method used in forming a memory array (e.g., 12) comprising strings (e.g., 49) of memory cells (e.g., 56) comprises forming a stack (e.g., 18) comprising vertically-alternating first tiers (e.g., 22) and second tiers (e.g., 20) comprising different composition first insulative material (e.g., 26) and second insulative material (e.g., 24), respectively, on a substrate (e.g., 11). The stack comprises memory-block regions (e.g., 58) extending from a memory-array region (e.g., 12) into a stair-step region (e.g., 13) along a first direction (e.g., 55). An example such stack 18 beyond that exemplified by FIG. 14 would be that shown by FIGS. 2-6 where insulative material 26 (not there-shown) is substituted for conducting material 48 at this point of processing and where trenches 40* have not yet been formed. Accordingly, and by way of example only, channel-material strings (e.g., 53) have also been formed and that extend through the first tiers and the second tiers in the memory-block regions.

Figure 8:
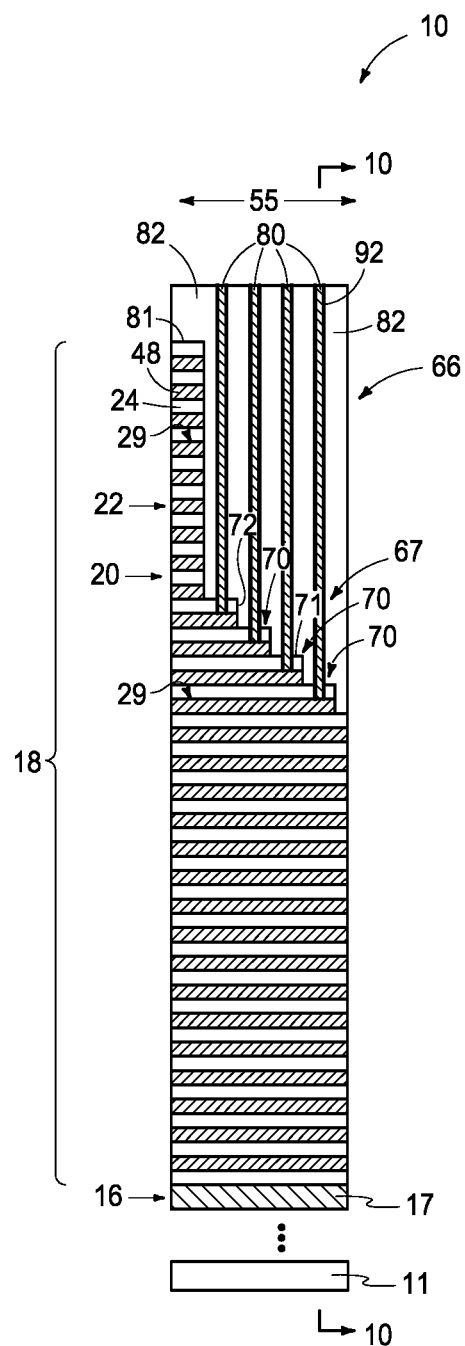
Figure 9:
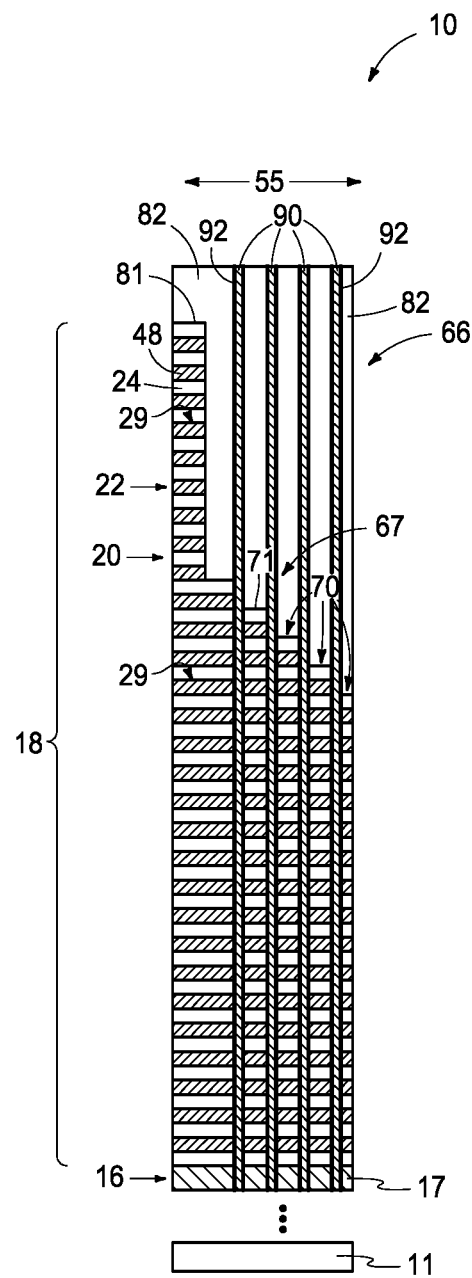
Figure 10:
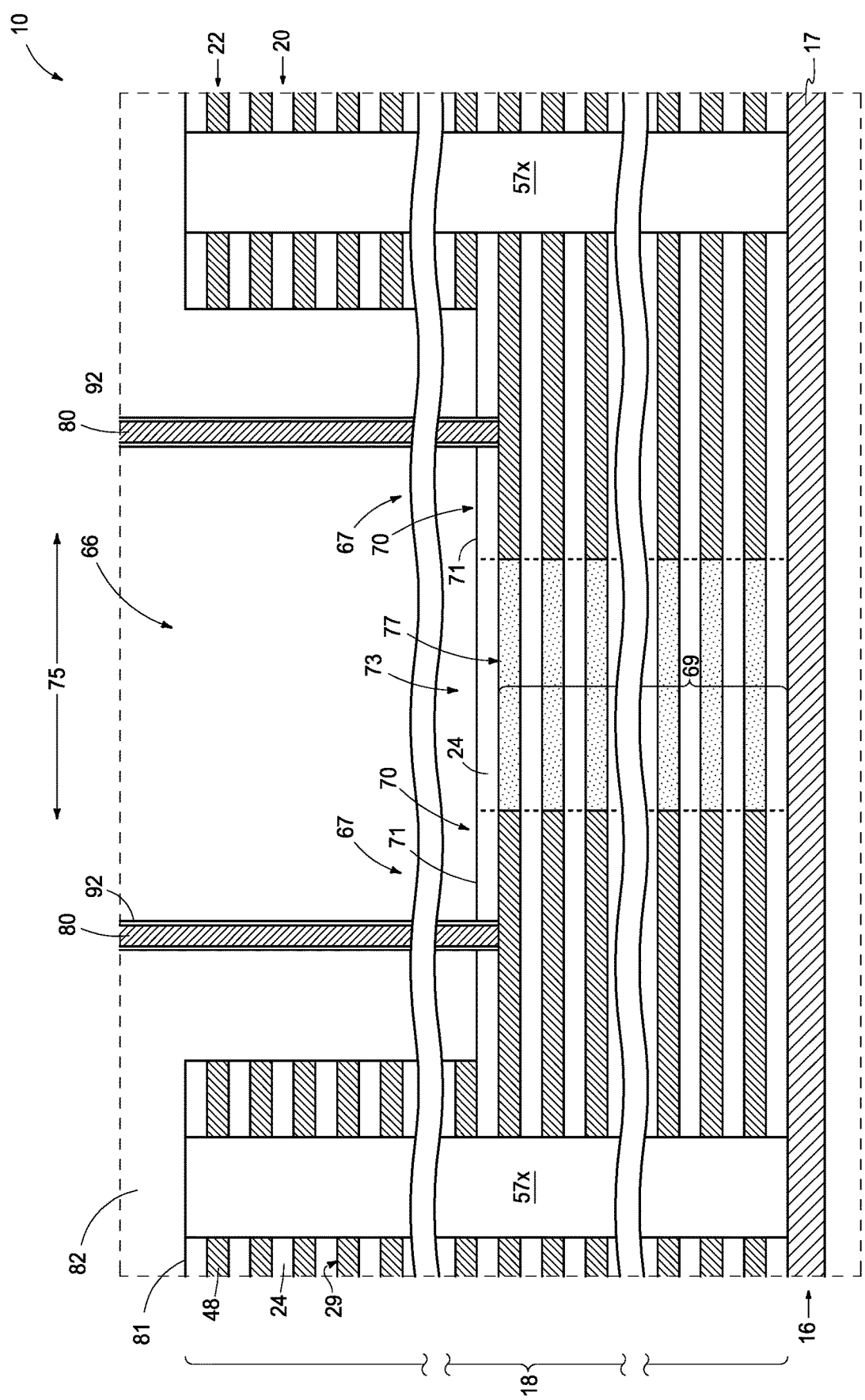
Figure 11:
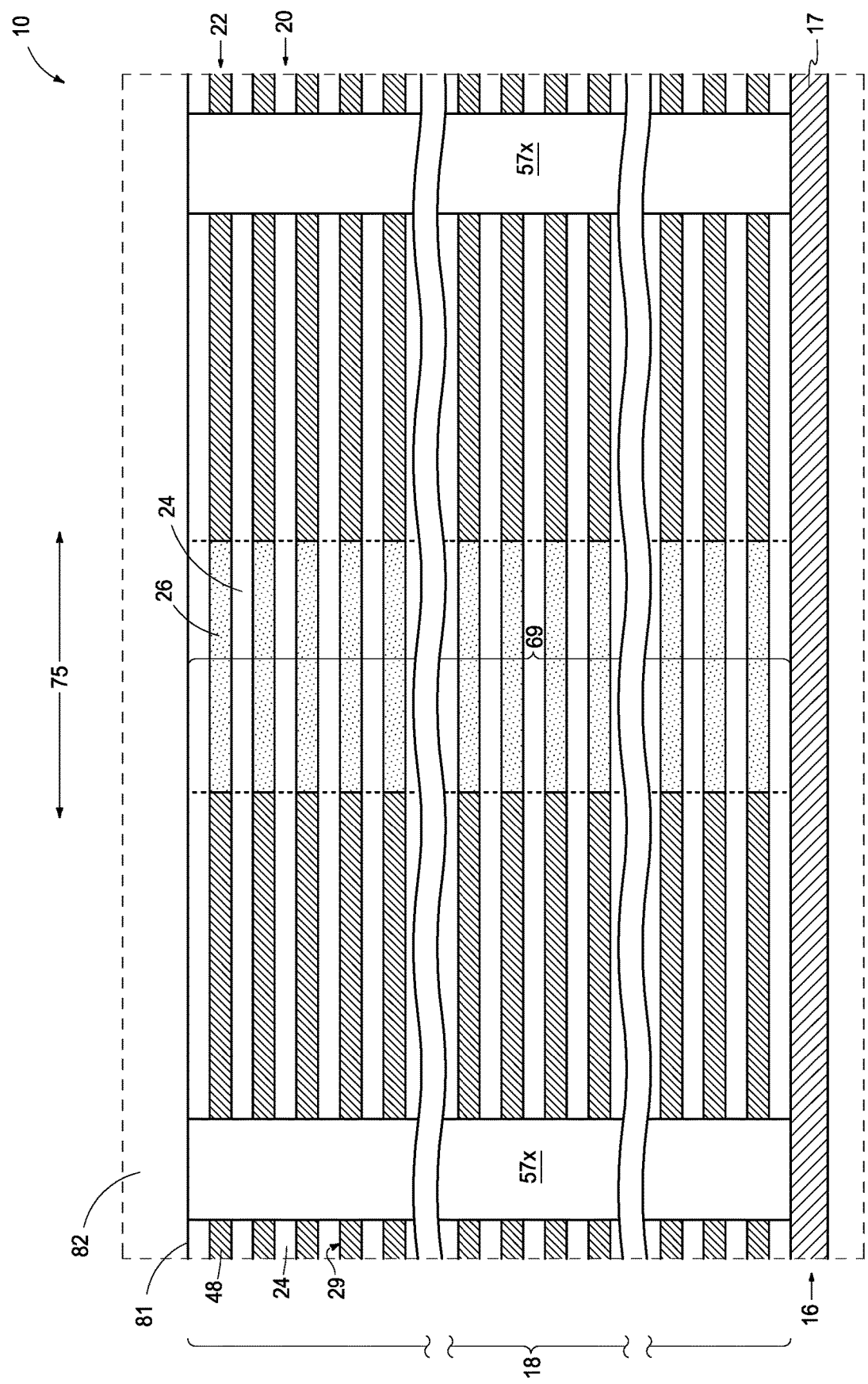
Figure 12:
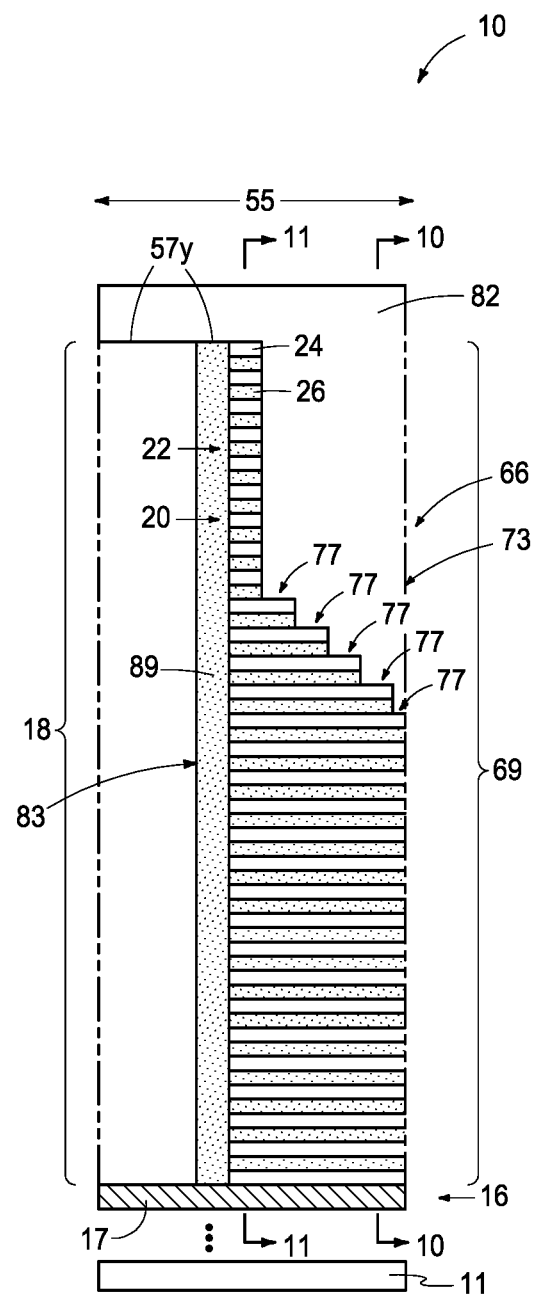
Figure 15:
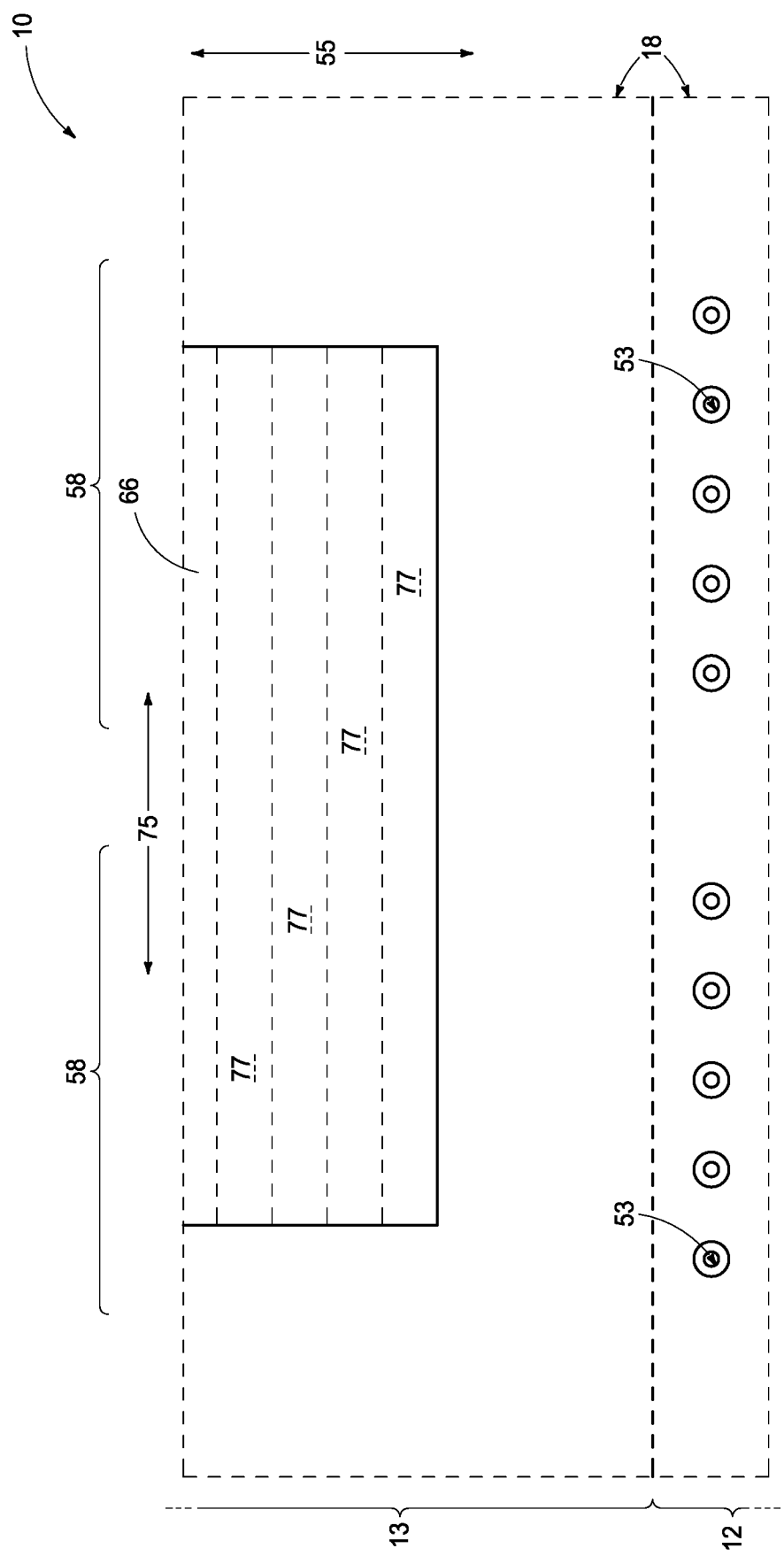

Referring to FIG. 15, a stair-step structure (e.g., 66) comprising the first and second tiers has been formed in the stair-step region across and that spans between two immediately-adjacent of the memory-block regions along a second direction (e.g., 75) (e.g., including FIGS. 8 and 9 where conducting material 48 is insulative material 26 at this point of processing, and conductive vias 80 and 90 have not yet been formed).

Figure 16:
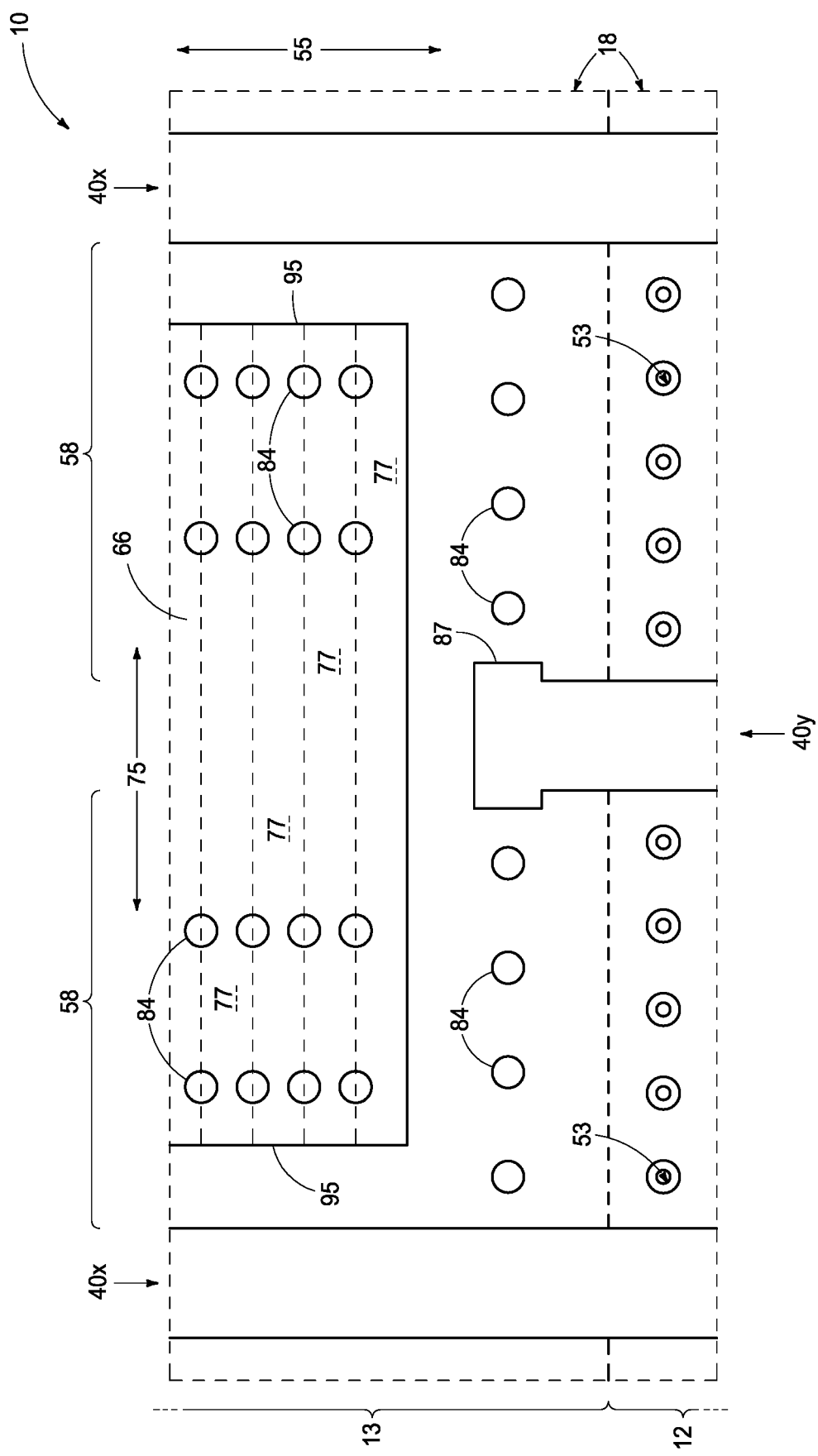

Referring to FIG. 16, trenches (e.g., 40*) have been formed along the first direction that are individually laterally between immediately-adjacent of the memory blocks in the memory-array region. Two of the trenches (e.g., 40x) in the first direction extend completely across the stair-step structure laterally-outward of opposing sides (e.g., 95) of the stair-step structure. One of the trenches (e.g., 40y) is laterally between the two trenches and does not extend completely across the stair-step structure in the first direction. In one embodiment and as shown, an end portion of the one trench (e.g., 87) may be formed to have a maximum lateral width that is greater than that of a portion of such one trench that is distal from such end portion. TAV openings (e.g., 84), when formed, may be formed commensurately with trenches 40* (e.g., using a common masking step [at least one]).

Figure 17:
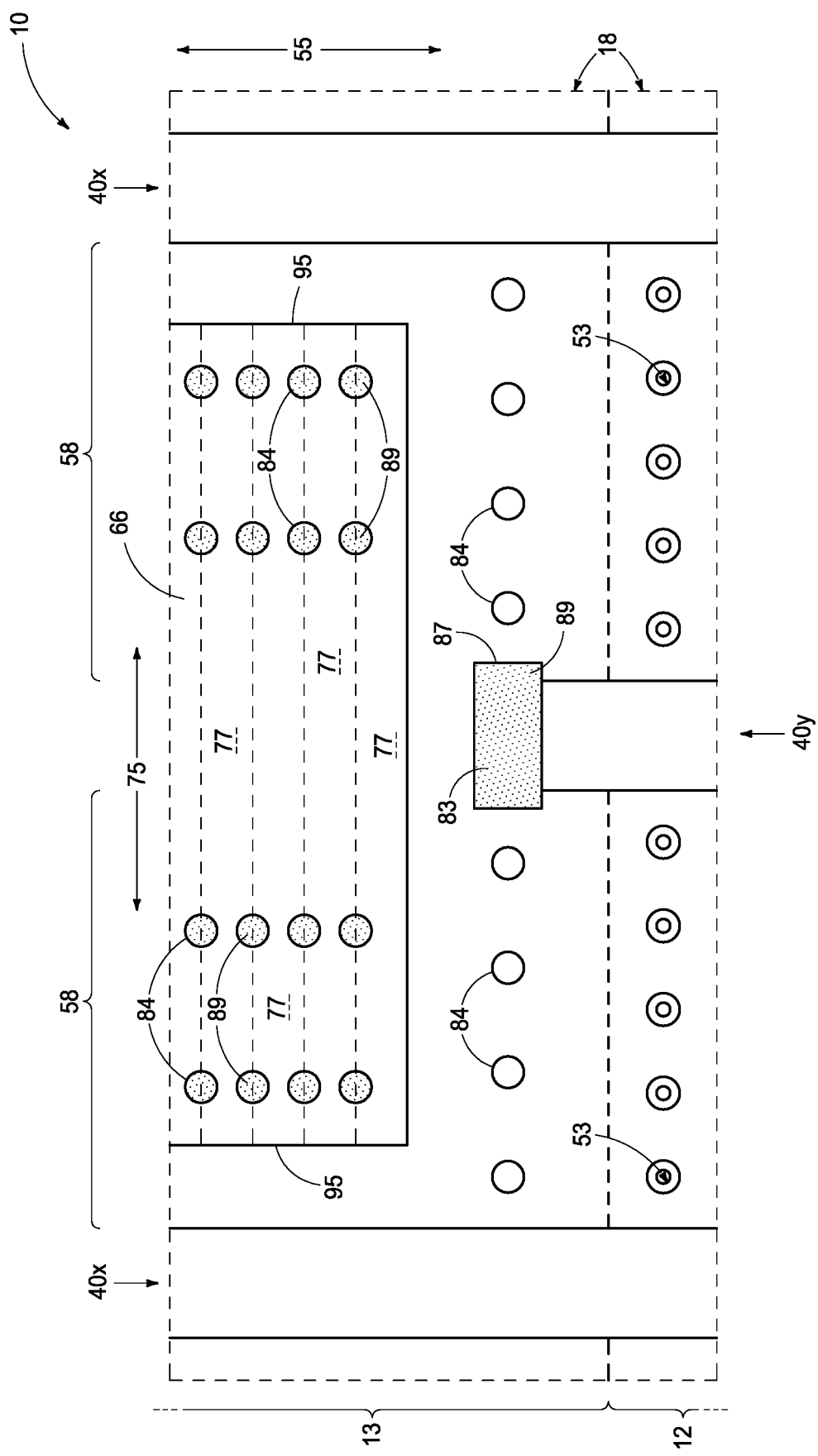

Referring to FIG. 17, insulative material (e.g., 89; silicon dioxide and/or silicon nitride) has been formed in the end portion of trench 40y and in some of the TAV openings (e.g., while masking the other portion of trench 40y, all portions of trenches 40x, and all other TAV openings in which operative TAVs are to be formed), thus forming end portion 83 of what will be a wall 57y.

Figure 18:
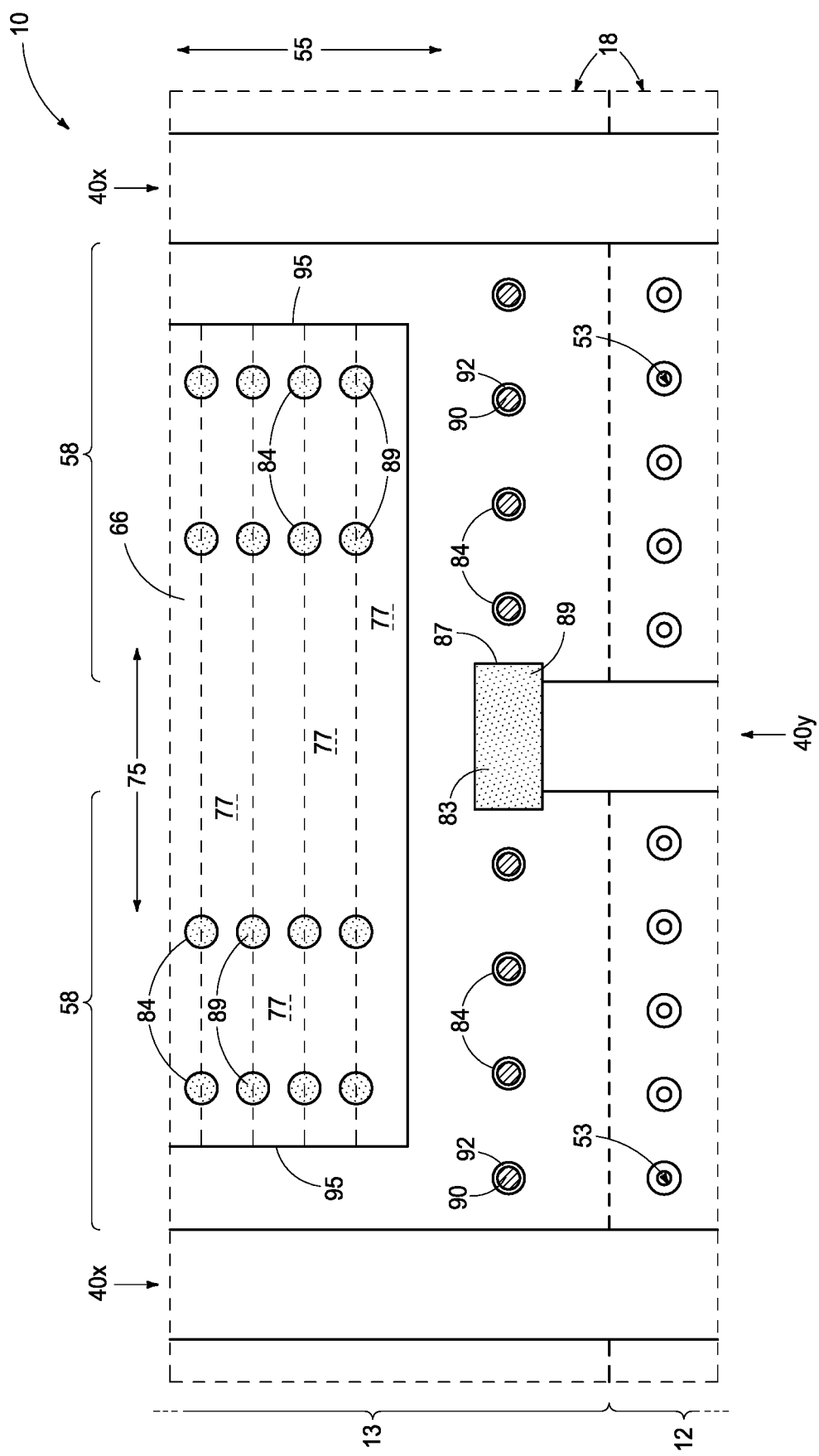

Referring to FIG. 18, example operative TAVs 90 have been formed in the upwardly-open TAV openings 84 of FIG. 17. By way of example, operative TAVs 90 could also be formed in openings 84 in stair-step region 66 at this time (not shown), if desired, by masking wall end portion 83 while exhuming insulative material in such openings prior to forming the depicted TAVs 90. Alternately, such TAVs could remain dummy structures in the finished construction.

Figure 19:
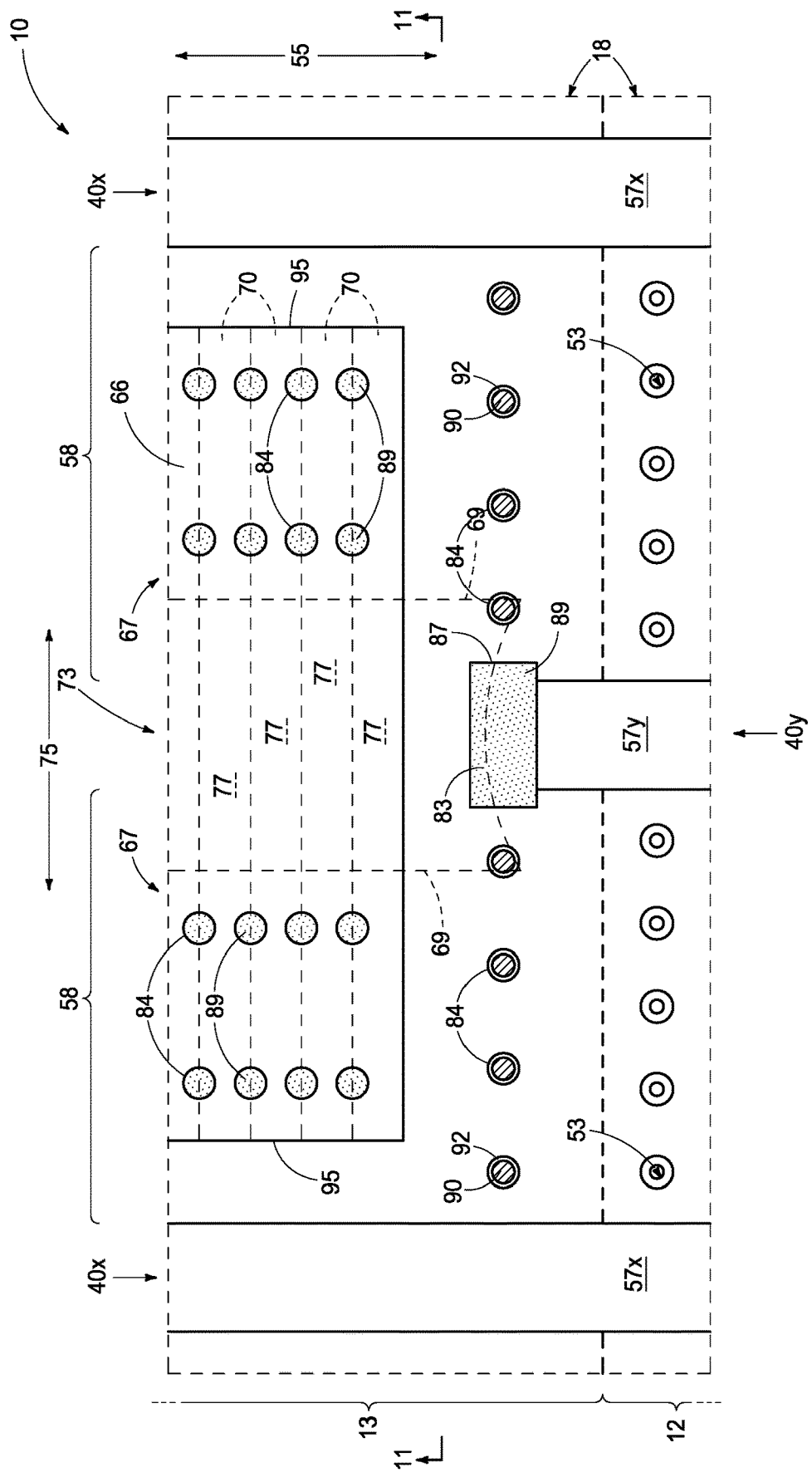

Referring to FIG. 19 (and FIG. 11), the first insulative material (e.g., 26) has been selectively etched relative to the second insulative material (e.g., 24) through the two and one trenches to leave a stack (e.g., 69) of the first and second insulative materials in the stair-step structure that is laterally-spaced from two trenches 40x. Conductive material (e.g., 48) has then been formed in the first tiers through the two and one trenches and a wall 57* is formed in individual of the one and two trenches. Such would occur in all stair-step structures 66.

Figure 20:
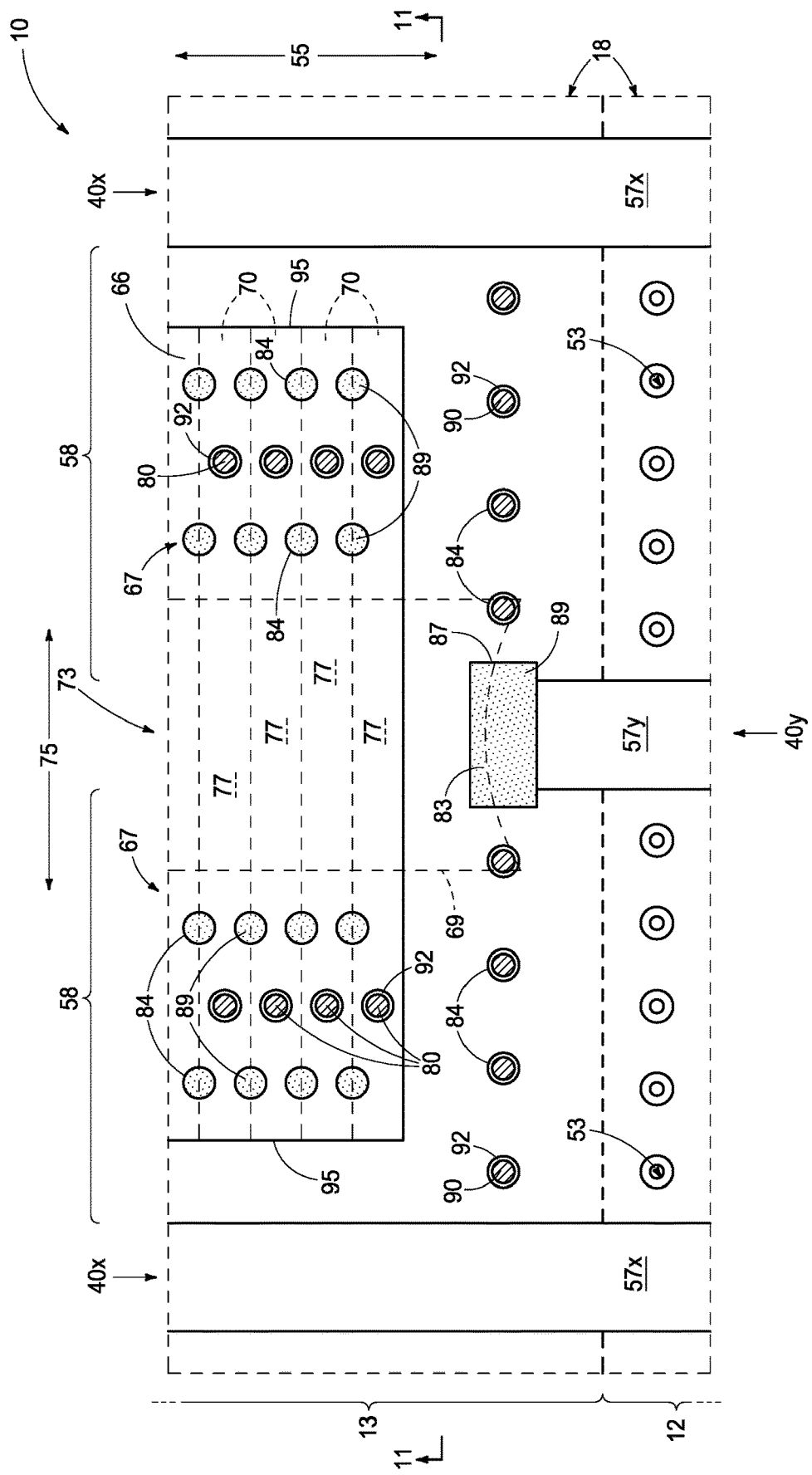

Referring to FIG. 20, conductive vias 80 have been formed, thus forming a construction analogous to that shown by FIG. 7 (but with different and more TAVs 90 and by way of example only).

Any other attribute(s) or aspect(s) as shown and/or described herein with respect to other embodiments may be used.

Figure 21:
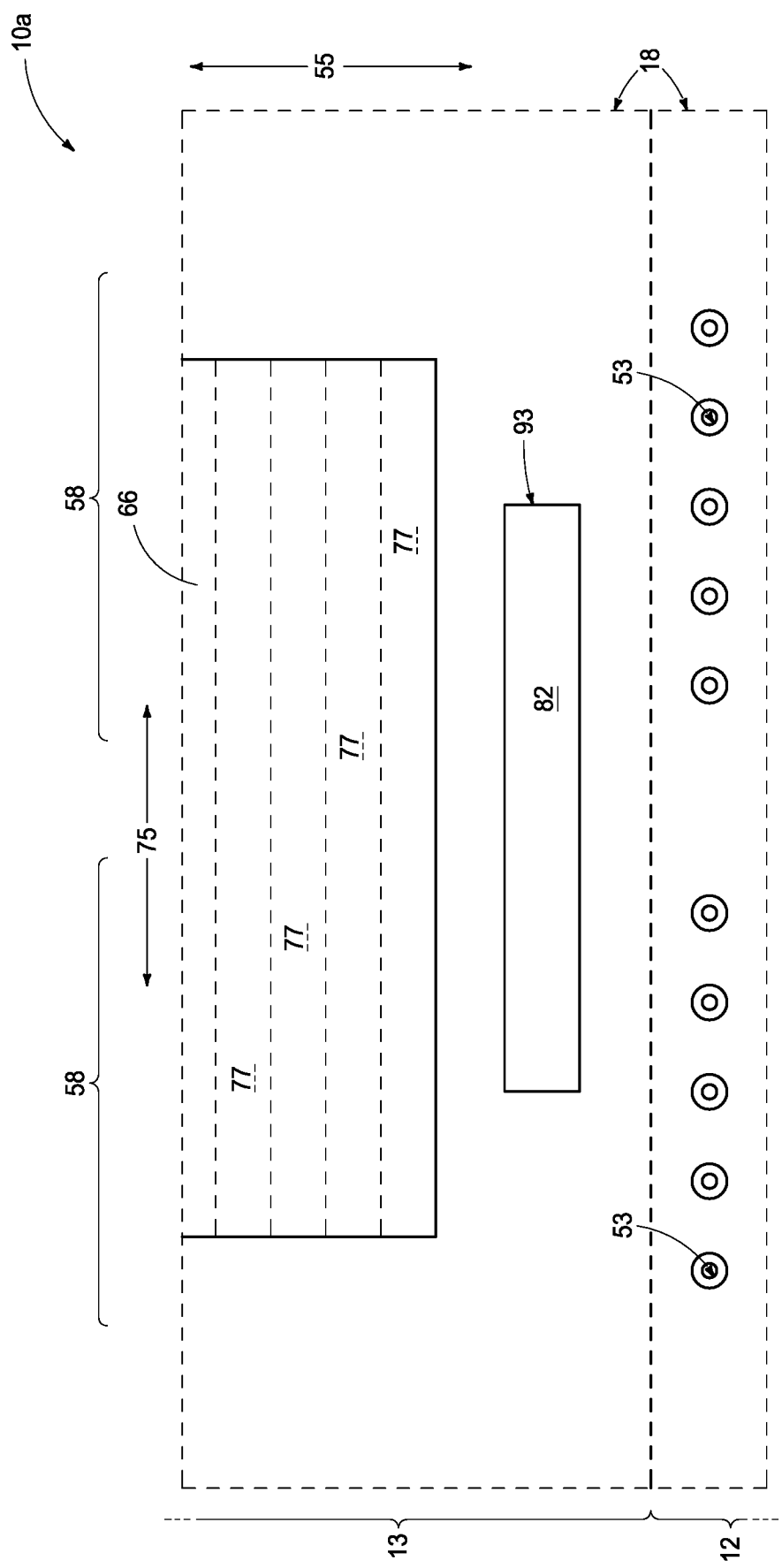

Example second method embodiments are described largely with reference to FIGS. 21-26 to form a construction analogous to construction 10a of FIG. 13. Such method may occur independent of order of processing steps unless otherwise so stated or inherent. FIG. 21 shows processing analogous to and largely through that shown by FIG. 15 with respect to the immediately-above-described method embodiment. However, FIG. 21 shows an opening 93 having been formed, in one embodiment, at least somewhat commensurately with forming stair-step structure 66 (e.g., using a common masking step). Opening 93 has a horizontal outline corresponding to end portion 83a of FIG. 13, extends through stack 18, and may be filled with insulator material 82.

Figure 22:
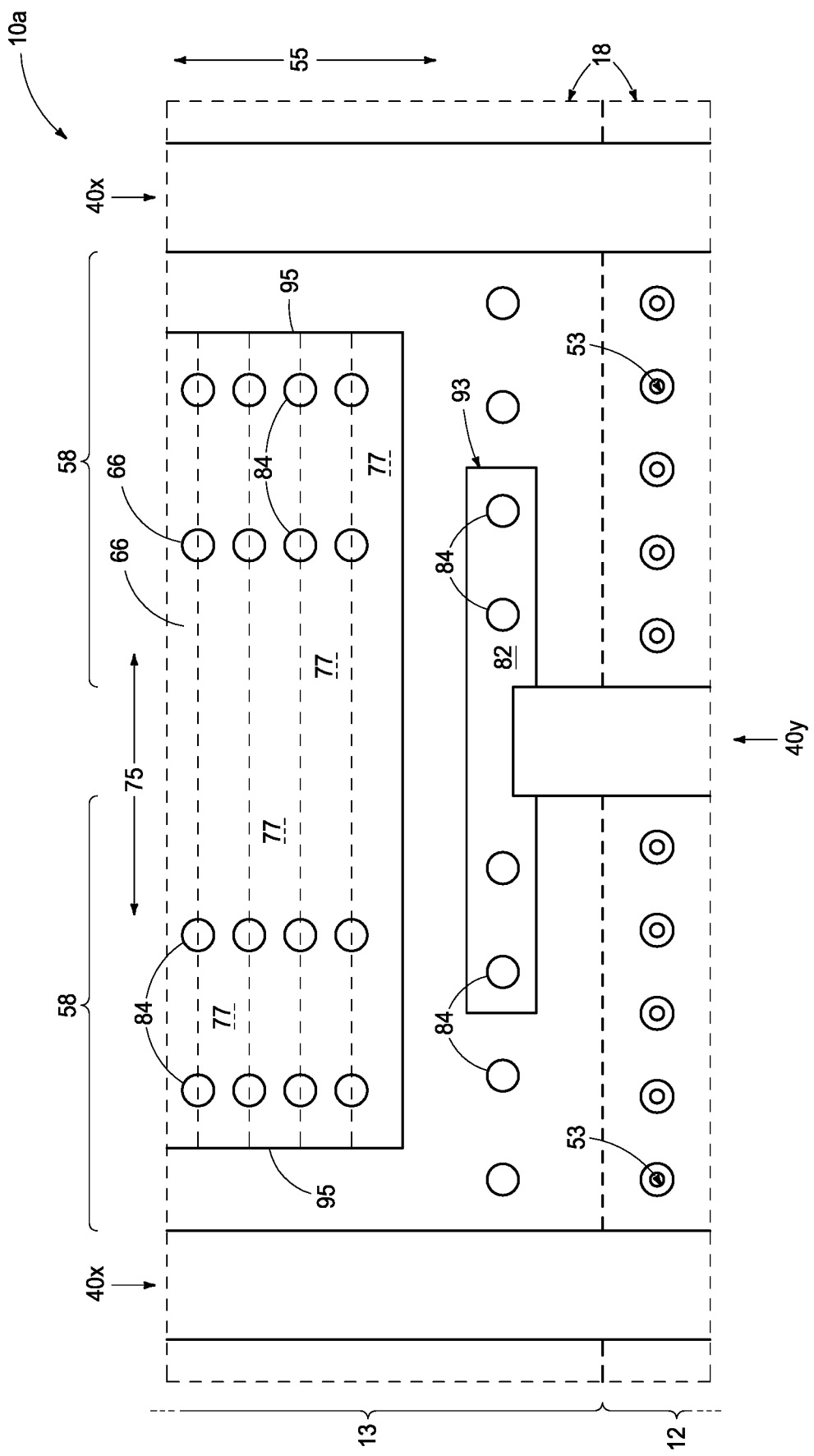
Figure 23:
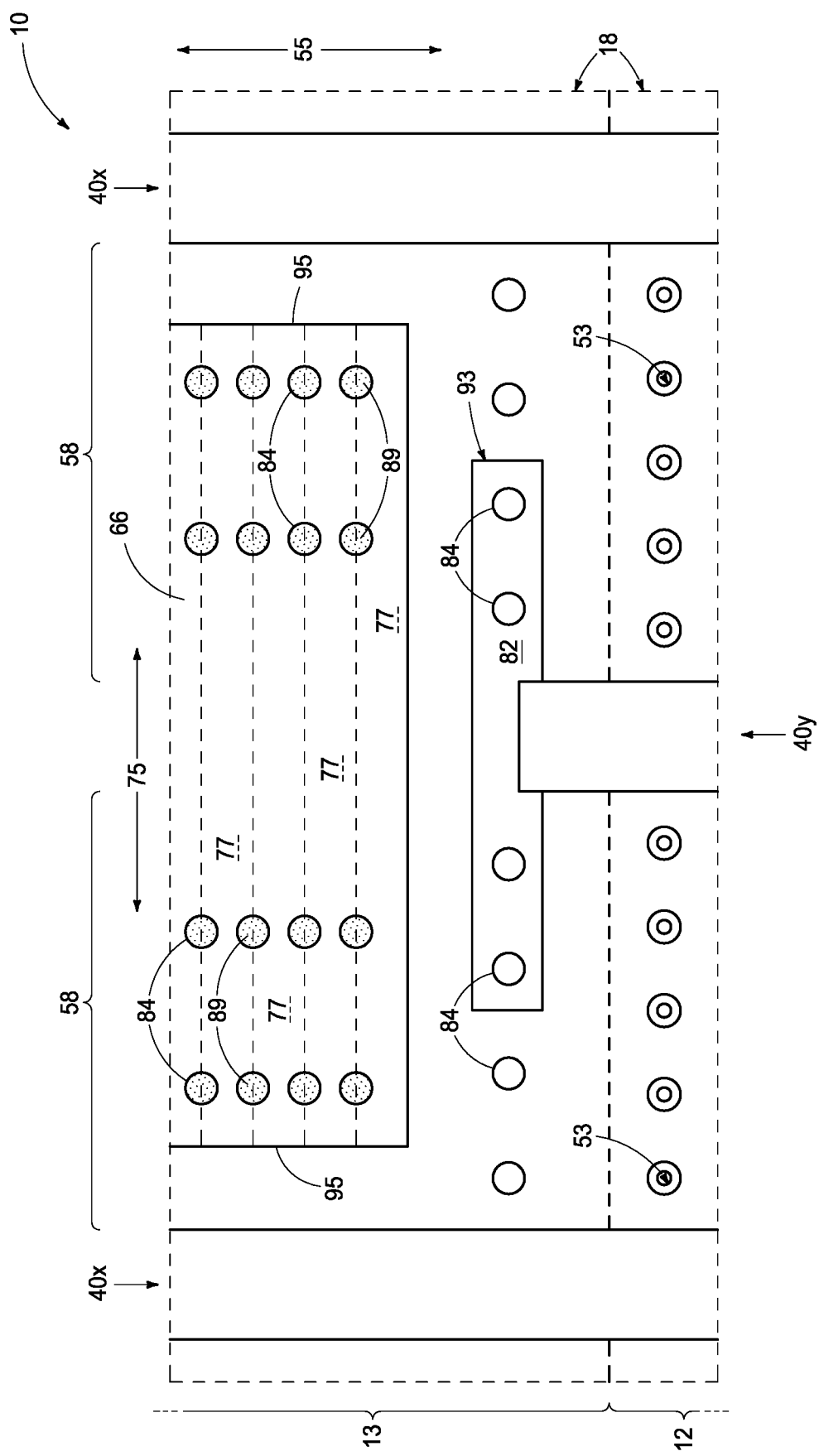
Figure 24:
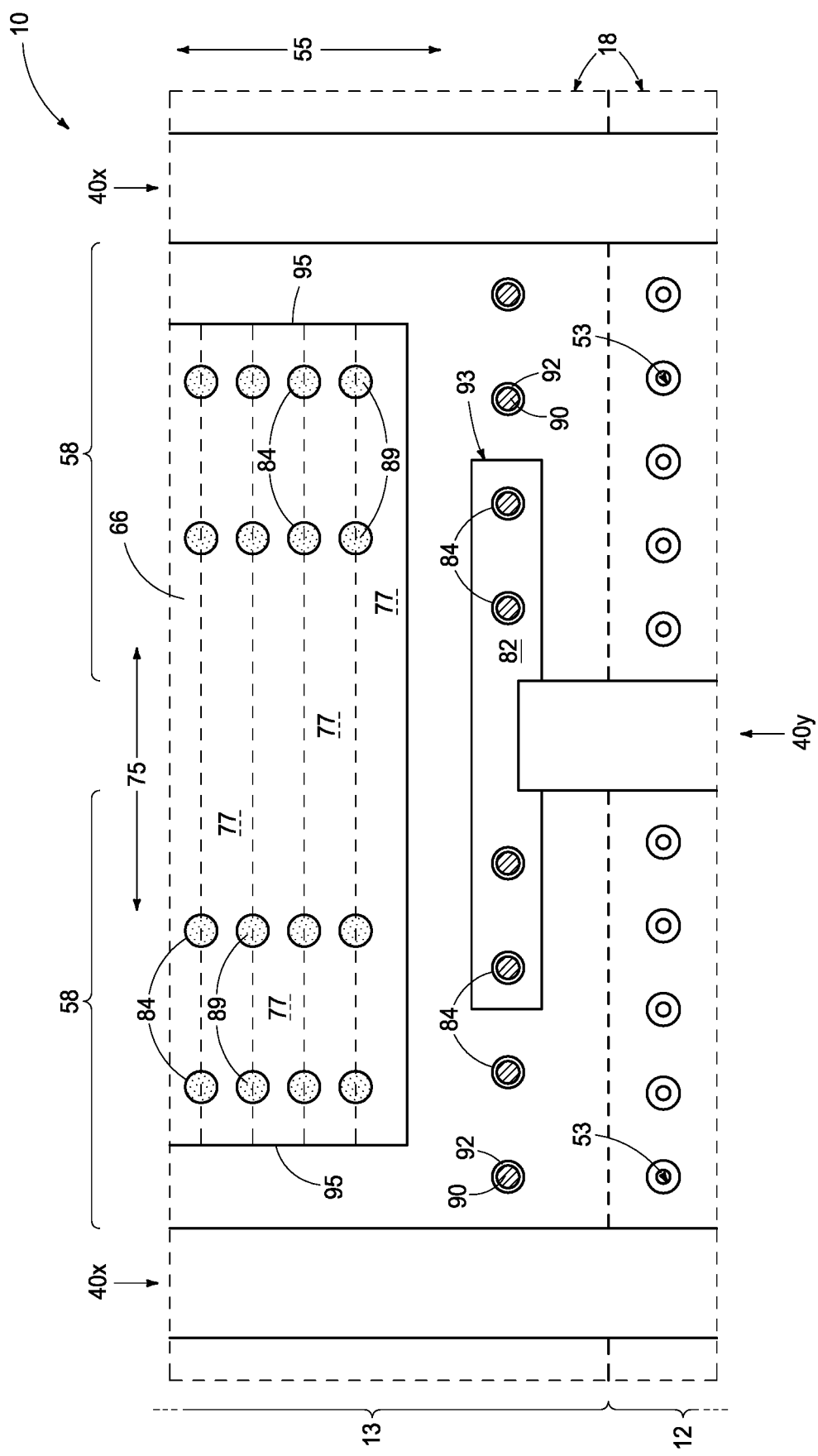
Figure 25:
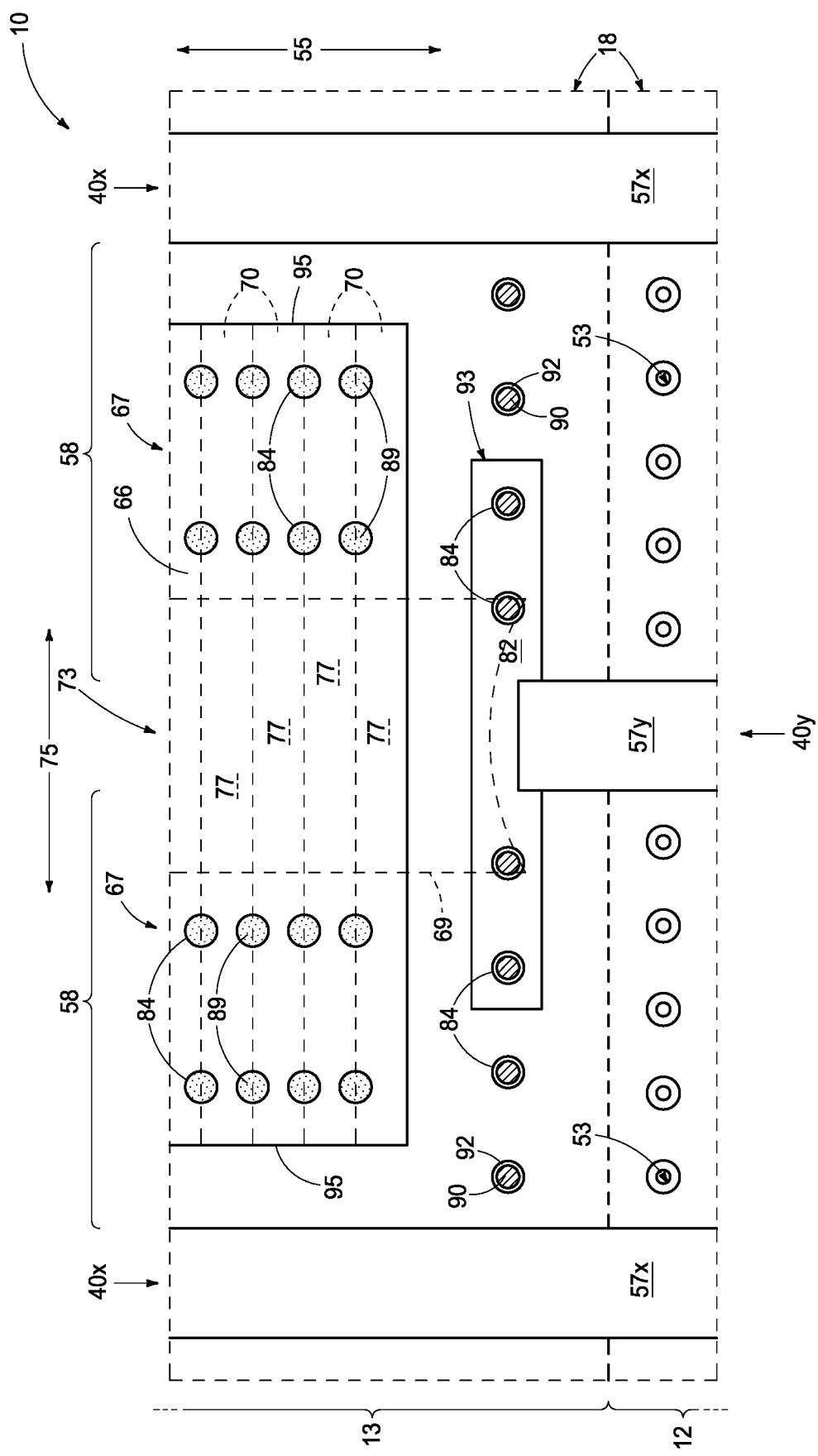
Figure 26:
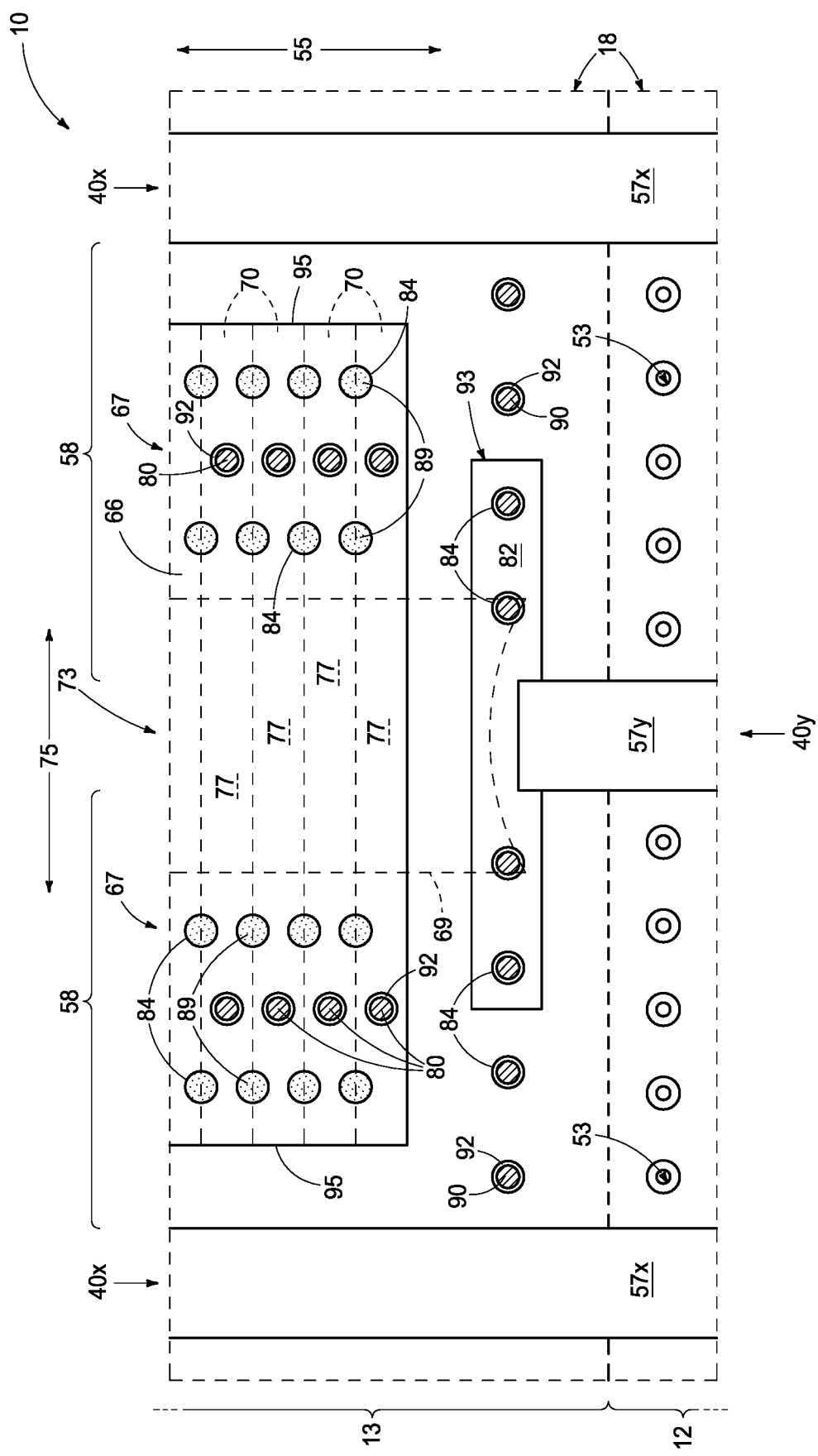

FIG. 22 shows processing analogous to that shown by FIG. 16. Trench 40y may be formed to extend into insulator material 82 within opening 93, as shown.

FIGS. 23, 24, 25, and 26 show processing analogous to that shown by FIGS. 17, 18, 19, and 20, respectively.

In one embodiment, the wall in the one trench includes an end portion that extends into the stack of the first and second insulative materials (e.g., 83/83a). In one embodiment, the wall in the one trench is horizontally-longitudinally-elongated, the end portion is everywhere horizontally-longitudinally-spaced from where all of the channel-material strings extend through the first tiers and the second tiers, the end portion has a maximum lateral width that is greater than a maximum lateral width of that portion of the wall in the one trench that is not horizontally-longitudinally-spaced from where all of the channel-material strings extend through the first tiers and the second tiers (e.g., 83/83a).

In one embodiment, the wall in the one trench is horizontally-longitudinally-elongated, the end portion is everywhere horizontally-longitudinally-spaced from where all of the channel-material strings extend through the first tiers and the second tiers, the end portion and that portion of the wall in the one trench that is not horizontally-longitudinally-spaced from where all of the channel-material strings extend through the first tiers and the second tiers are formed at different times relative one another (e.g., FIGS. 14-20 and FIGS. 21-26). In one such embodiment, the end portion is formed before forming that portion of the wall in the one trench that is not horizontally-longitudinally-spaced from where all of the channel-material strings extend through the first tiers and the second tiers (e.g., FIGS. 14-20 and FIGS. 21-26). In one such embodiment, the stair-step structure and the end portion are formed using a common masking step (e.g., FIGS. 21-26). In another such embodiment, the stair-step structure and the end portion are not formed using a common masking step (e.g., FIGS. 14-20). In one embodiment, stairs of the stair-step structure are before forming the end portion (e.g., FIGS. 21-26). In one embodiment, the stair-step structure after the etching forms the stack of the first and second insulative materials in the stair-step structure that is laterally-spaced from the two trenches to comprise a flight of inoperative stairs (e.g., 73).

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, memory circuitry comprising strings of memory cells comprising memory blocks individually comprises a vertical stack comprising alternating insulative tiers and conductive tiers. Channel-material strings of memory cells extend through the insulative tiers and the conductive tiers in a memory-array region. The insulative tiers and the conductive tiers of the memory blocks extend from the memory-array region into a stair-step region. Individual of the memory blocks in the stair-step region comprise a flight of operative stairs. Individual of the operative stairs comprise one of the conductive tiers. At least some immediately-laterally-adjacent of the individual memory blocks in the stair-step region have their flights of operative stairs laterally-separated by a stack comprising two vertically-alternating different-composition insulative materials.

In some embodiments, memory circuitry comprising strings of memory cells comprising memory blocks individually comprise a vertical stack comprising alternating insulative tiers and conductive tiers. Channel-material strings of memory cells extend through the insulative tiers and the conductive tiers in a memory-array region. The insulative tiers and the conductive tiers of the memory blocks extend from the memory-array region into a stair-step region. Individual of the memory blocks in the stair-step region comprise a flight of operative stairs. Individual of the operative stairs comprise one of the conductive tiers. At least some immediately-laterally-adjacent of the individual memory blocks in the stair-step region have their flights of operative stairs laterally-separated by a flight of inoperative stairs.

In some embodiments, memory circuitry comprising strings of memory cells comprising memory blocks individually comprises a vertical stack comprising alternating insulative tiers and conductive tiers. Channel-material strings of memory cells extend through the insulative tiers and the conductive tiers. Walls are individually laterally between immediately-laterally-adjacent of the individual memory blocks. At least some of the walls individually comprise an end portion that is in a stack comprising two vertically-alternating different-composition insulative materials.

In some embodiments, memory circuitry comprising strings of memory cells comprises two memory-array regions having a stair-step region there-between. Memory blocks in each of the two memory-array regions and individually comprise a vertical stack comprising alternating insulative tiers and conductive tiers. Channel-material strings of memory cells extend through the insulative tiers and the conductive tiers in the memory blocks in the two memory-array regions. Walls are individually laterally between immediately-adjacent of the memory blocks in the two memory-array regions. The walls comprise a first set of the walls that extend from one of the two memory-array regions into the other of the two memory-array regions across the stair-step region. The walls comprise a second set of walls that do not extend from one of the two memory-array regions into the other of the two memory-array regions across the stair-step region.

In some embodiments, a method used in forming a memory array comprising strings of memory cells comprises forming a stack comprising vertically-alternating first tiers and second tiers comprising different composition first insulative material and second insulative material, respectively, on a substrate. The stack comprises memory-block regions extending from a memory-array region into a stair-step region along a first direction. A stair-step structure comprising the first and second tiers is formed in the stair-step region across and that spans between two immediately-adjacent of the memory-block regions along a second direction. Trenches are formed along the first direction that are individually laterally between immediately-adjacent of the memory blocks in the memory-array region. Two of the trenches in the first direction extend completely across the stair-step structure laterally-outward of opposing sides of the stair-step structure. One of the trenches is laterally between the two trenches and does not extend completely across the stair-step structure in the first direction. The first insulative material is etched selectively relative to the second insulative material through the two and one trenches to leave a stack of the first and second insulative materials in the stair-step structure that is laterally-spaced from the two trenches. After the etching, conductive material is formed in the first tiers through the one and two trenches. A wall is formed in individual of the one and two trenches. Channel-material strings are formed that extend through the first tiers and the second tiers in the memory-block regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Memory circuitry comprising strings of memory cells, comprising:
   memory blocks individually comprising a vertical stack comprising alternating insulative tiers and conductive tiers, channel-material strings of memory cells extending through the insulative tiers and the conductive tiers in a memory-array region, the insulative tiers and the conductive tiers of the memory blocks extending from the memory-array region into a stair-step region;
   individual of the memory blocks in the stair-step region comprising a flight of operative stairs, individual of the operative stairs comprising one of the conductive tiers;
   at least some immediately-laterally-adjacent of the individual memory blocks in the stair-step region having their flights of operative stairs laterally-separated by a stack comprising two vertically-alternating different-composition insulative materials; and
   walls that are individually laterally between the immediately-laterally-adjacent memory blocks in the memory-array region, the walls not being laterally-adjacent said flights of operative stairs, the walls individually comprising an end portion that is in the stack comprising the two vertically-alternating different-composition insulative materials.

2. The memory circuitry of claim 1 wherein the at least some consist of every-other-one of the memory blocks.

3. The memory circuitry of claim 1 wherein the walls individually are horizontally-longitudinally-elongated, the end portion being everywhere horizontally-longitudinally-spaced from where all of the channel-material strings extend through the insulative tiers and the conductive tiers, the end portion having a maximum lateral width that is greater than a maximum lateral width of that portion of its wall that is not horizontally-longitudinally-spaced from where all of the channel-material strings extend through the insulative tiers and the conductive tiers.

4. The memory circuitry of claim 1 wherein the walls are comprised by a first set of walls and further comprising a second set of walls, the walls of the first and second sets being individually laterally between the immediately-adjacent memory blocks, the walls of the second set being horizontally longer than the walls of the first set.

5. The memory circuitry of claim 4 wherein individual of the walls of the first and second sets laterally alternate every-other-one with individual of the walls of the second set.

6. Memory circuitry comprising strings of memory cells, comprising:
   memory blocks individually comprising a vertical stack comprising alternating insulative tiers and conductive tiers, channel-material strings of memory cells extending through the insulative tiers and the conductive tiers in a memory-array region, the insulative tiers and the conductive tiers of the memory blocks extending from the memory-array region into a stair-step region;
   individual of the memory blocks in the stair-step region comprising a flight of operative stairs, individual of the operative stairs comprising one of the conductive tiers;
   walls that are individually laterally between the immediately-laterally-adjacent memory blocks in the memory-array region and extending only partially into the stair-step region; and
   at least some immediately-laterally-adjacent of the individual memory blocks in the stair-step region having their flights of operative stairs laterally-separated by a flight of inoperative stairs.

7. The memory circuitry of claim 6 wherein the flight of inoperative stairs comprises a stack comprising two vertically-alternating different-composition insulative materials.

8. The memory circuitry of claim 7 wherein individual of the inoperative stairs comprise one of each of the two different-composition insulative materials.

9. The memory circuitry of claim 8 wherein individual of the inoperative stairs comprise only one of each of the two different-composition insulative materials.

10. The memory circuitry of claim 6 wherein the at least some consist of every-other-one of the memory blocks.

11. The memory circuitry of claim 6 wherein the walls are comprised by a first set of walls and further comprising a second set of walls, the walls of the second set being horizontally longer than the walls of the first set.

12. The memory circuitry of claim 11 wherein individual of the walls of the first set laterally alternate every-other-one with individual of the walls of the second set.

13. Memory circuitry comprising strings of memory cells, the memory circuitry comprising:
   memory blocks individually comprising a vertical stack comprising alternating insulative tiers and conductive tiers, channel-material strings of memory cells extending through the insulative tiers and the conductive tiers;
   walls that are individually laterally between immediately-laterally-adjacent of the individual memory blocks; and
   at least some of the walls individually comprising an end portion that is in an insulative stack comprising two vertically-alternating different-composition insulative materials, the insulative stack being within a stair step region of the memory circuitry, the walls being individually horizontally-longitudinally-elongated, the end portion being everywhere horizontally-longitudinally-spaced from where all of the channel-material strings extend through the insulative tiers and the conductive tiers, the end portion having a maximum lateral width that is greater than a maximum lateral width of that portion of its wall that is not horizontally-longitudinally-spaced from where all of the channel-material strings extend through the insulative tiers and the conductive tiers.

14. The memory circuitry of claim 13 wherein the maximum lateral width of the end portion is less than twice as great as the maximum lateral width of that portion of its wall that is not horizontally-longitudinally-spaced from where all of the channel-material strings extend through the insulative tiers and the conductive tiers.

15. The memory circuitry of claim 13 wherein the maximum lateral width of the end portion is at least twice as great as the maximum lateral width of that portion of its wall that is not horizontally-longitudinally-spaced from where all of the channel-material strings extend through the insulative tiers and the conductive tiers.

16. The memory circuitry of claim 15 wherein the maximum lateral width of the end portion is at least three times as great as the maximum lateral width of that portion of its wall that is not horizontally-longitudinally-spaced from where all of the channel-material strings extend through the insulative tiers and the conductive tiers.

17. Memory circuitry comprising strings of memory cells, comprising:
   two memory-array regions having a stair-step region there-between;

memory blocks in each of the two memory-array regions that individually comprise a vertical stack comprising alternating insulative tiers and conductive tiers, channel-material strings of memory cells extending through the insulative tiers and the conductive tiers in the memory blocks in the two memory-array regions; and walls that are individually laterally between immediately-adjacent of the memory blocks in the two memory-array regions, the walls comprising a first set of the walls that extend from one of the two memory-array regions into the other of the two memory-array regions across the stair-step region, the walls comprising a second set of walls that extend from one of the two memory-array regions only partially into the stair-step region.

18. The memory circuitry of claim 17 wherein, individual of the memory blocks in the stair-step region comprise a flight of operative stairs, individual of the operative stairs comprising one of the conductive tiers; and at least some immediately-laterally-adjacent of the individual memory blocks in the stair-step region having their flights of operative stairs laterally-separated by a stack comprising two vertically-alternating different-composition insulative materials.

19. The memory circuitry of claim 17 wherein, individual of the memory blocks in the stair-step region comprise a flight of operative stairs, individual of the operative stairs comprising one of the conductive tiers; and at least some immediately-laterally-adjacent of the individual memory blocks in the stair-step region having their flights of operative stairs laterally-separated by a flight of inoperative stairs.

20. The memory circuitry of claim 17 wherein the walls of the second set individually comprise an end portion that is in a stack comprising two vertically-alternating different-composition insulative materials.

* * * * *